(12) United States Patent
Choi et al.

(10) Patent No.: US 11,082,043 B2
(45) Date of Patent: Aug. 3, 2021

(54) MEMORY DEVICE

(71) Applicant: SK hynix Inc., Icheon-si (KR)

(72) Inventors: Won Ha Choi, Icheon-si (KR); Oung Sic Cho, Icheon-si (KR); Jong Hoon Oh, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/889,253

(22) Filed: Jun. 1, 2020

(65) Prior Publication Data

US 2020/0295757 A1 Sep. 17, 2020

Related U.S. Application Data

(63) Continuation-in-part of application No. 16/661,685, filed on Oct. 23, 2019, which is a continuation of application No. 16/101,998, filed on Aug. 13, 2018, now Pat. No. 10,491,215, which is a continuation of application No. 15/626,648, filed on Jun. 19, 2017, now Pat. No. 10,075,165, which is a continuation of application No. 14/661,687, filed on Mar. 18, 2015, now Pat. No. 9,716,497, application No. 16/889,253, filed on Jun. 1, 2020, which is a continuation-in-part of application No. 15/248,240, filed on Aug. 26, 2016, and a continuation-in-part of application No. 16/135,980, filed on Sep. 19, 2018, which is a continuation of application No. 15/165,214, filed on May 26, 2016, now Pat. No. 10,108,491.

(30) Foreign Application Priority Data

Oct. 28, 2014 (KR) .................. 10-2014-0147541
Dec. 24, 2015 (KR) .................. 10-2015-0185948

Apr. 19, 2016 (KR) .................. 10-2016-0047345

(51) Int. Cl.
*H03K 19/00* (2006.01)

(52) U.S. Cl.
CPC .................. *H03K 19/0005* (2013.01)

(58) Field of Classification Search
CPC .................................................. H03K 19/0005
USPC ................................................. 326/30
See application file for complete search history.

(56) References Cited

U.S. PATENT DOCUMENTS 7,269,043 B2 9/2007 Lee
7,606,987 B2 10/2009 Sawa et al.
(Continued)

FOREIGN PATENT DOCUMENTS

KR 10-2005-0100290 A 10/2005
KR 1020110013704 A 2/2011
(Continued)

OTHER PUBLICATIONS

KR Office Action dated Sep. 25, 2020 for Korean Application No. KR 10-2014-0147541, 7 pages (Non-English).
(Continued)

*Primary Examiner* — Don P Le
(74) *Attorney, Agent, or Firm* — Weaver Austin Villeneuve & Sampson LLP

(57) ABSTRACT

A memory device comprising: a plurality of memories, a plurality of access units and a controller configured to control data from an access unit according to operation cycle different to another access unit whose form factor is different to that of the access unit.

20 Claims, 26 Drawing Sheets

(56) References Cited

U.S. PATENT DOCUMENTS

| | | |
|---|---|---|
| 7,696,778 B1 | 4/2010 | Sreeramaneni et al. |
| 8,225,006 B1 | 7/2012 | Karamcheti |
| 8,417,873 B1 | 4/2013 | Karamcheti et al. |
| 8,904,082 B1 | 12/2014 | Brahmadathan et al. |
| 9,727,258 B1 | 8/2017 | Nazarian et al. |
| 9,760,494 B2 | 9/2017 | Gschwind et al. |
| 10,303,378 B2 | 5/2019 | Kim |
| 10,491,215 B2 | 11/2019 | Cho et al. |
| 2003/0079115 A1 | 4/2003 | Henry et al. |
| 2005/0044128 A1 | 2/2005 | Scott et al. |
| 2005/0226080 A1 | 10/2005 | Lee |
| 2006/0064546 A1 | 3/2006 | Arita et al. |
| 2006/0151614 A1 | 7/2006 | Nishizawa et al. |
| 2006/0179185 A1 | 8/2006 | Daly, Jr. et al. |
| 2008/0074138 A1 | 3/2008 | Lee |
| 2008/0082746 A1 | 4/2008 | Nakamura |
| 2008/0082766 A1 | 4/2008 | Okin et al. |
| 2008/0109595 A1 | 5/2008 | Rajan et al. |
| 2008/0162980 A1 | 7/2008 | Dahan et al. |
| 2011/0029696 A1 | 2/2011 | Uehara |
| 2011/0066798 A1 | 3/2011 | Kaiwa et al. |
| 2011/0102073 A1 | 5/2011 | Riho |
| 2011/0193590 A1 | 8/2011 | Nakagawa |
| 2011/0227234 A1 | 9/2011 | Nishizawa et al. |
| 2011/0242916 A1 | 10/2011 | Seol et al. |
| 2012/0185633 A1 | 6/2012 | Sano |
| 2013/0013970 A1 | 1/2013 | Tao et al. |
| 2013/0015880 A1 | 1/2013 | Haraguchi |
| 2013/0111299 A1 | 5/2013 | Hashimoto et al. |
| 2014/0268973 A1* | 9/2014 | Connolly ............ G11C 11/4093 365/63 |
| 2014/0344488 A1 | 11/2014 | Flynn et al. |
| 2014/0372696 A1 | 12/2014 | Tune et al. |
| 2015/0032965 A1 | 1/2015 | Sugimoto et al. |
| 2015/0117122 A1 | 4/2015 | Lee et al. |
| 2015/0186200 A1 | 7/2015 | Chen |
| 2015/0186275 A1 | 7/2015 | Moga et al. |
| 2015/0212879 A1 | 7/2015 | Choi et al. |
| 2016/0204782 A1 | 7/2016 | Lee et al. |
| 2016/0224247 A1 | 8/2016 | Woo et al. |
| 2017/0004040 A1* | 1/2017 | Chinnakkonda Vidyapoornachary ...................... G06F 3/0679 |
| 2017/0040049 A1 | 2/2017 | Arai et al. |
| 2017/0109091 A1 | 4/2017 | Gans |
| 2017/0185480 A1 | 6/2017 | Choi |
| 2017/0249223 A1 | 8/2017 | Sherlock et al. |
| 2017/0300239 A1 | 10/2017 | Choi et al. |
| 2017/0300411 A1 | 10/2017 | Choi et al. |
| 2017/0351451 A1 | 12/2017 | Gans |
| 2020/0293197 A1 | 9/2020 | Choi et al. |

FOREIGN PATENT DOCUMENTS

| | | |
|---|---|---|
| KR | 10-2013-0126321 A | 11/2013 |
| KR | 10-2014-0078261 A | 6/2014 |
| WO | 2005/004047 A | 1/2005 |

OTHER PUBLICATIONS

Notice of Allowance dated Feb. 8, 2021, U.S. Appl. No. 15/248,240.

* cited by examiner

| OP | ADDRESS | TAG | DIRTY | GUARD |
|---|---|---|---|---|
| DATA |||||

FIG. 8

MEMORY DEVICE

CROSS-REFERENCES TO RELATED APPLICATION

The present application is a continuation-in-part of U.S. application Ser. No. 16/661,685 filed on Oct. 23, 2019, which is a continuation of U.S. application Ser. No. 16/101,998 filed on Aug. 13, 2018, which is a continuation of U.S. application Ser. No. 15/626,648 filed on Jun. 19, 2017, which is a continuation of U.S. application Ser. No. 14/661,687 filed on Mar. 18, 2015, which claims priority under 35 U.S.C. § 119(a) to Korean Application No. 10-2014-0147541, filed on Oct. 28, 2014. The present application is also a continuation-in-part of U.S. application Ser. No. 15/248,240 filed on Aug. 26, 2016, which claims priority under 35 U.S.C. § 119(a) to Korean Application No. 10-2016-0047345 filed on Apr. 19, 2016. The present application is also a continuation-in-part of U.S. application Ser. No. 16/135,980 filed on Sep. 19, 2018, which is a continuation of U.S. application Ser. No. 15/165,214 filed on May 26, 2016, which claims priority under 35 U.S.C. § 119(a) to Korean Application No. 10-2015-0185948 filed on Dec. 24, 2015. All of the above are herein incorporated by reference in their entireties.

BACKGROUND

1. Technical Field

Various embodiments may generally relate to a controller, a memory device including the same, and method.

2. Related Art

Memory devices may include various types of memory. When various types of memory are included in one memory device, control schemes different from one another may be required in order to perform a read or write operation with respect to the various types of memory.

SUMMARY

In an embodiment, a system may be provided. The system may include a first semiconductor device, a second semiconductor device, a third semiconductor device and a fourth semiconductor device, wherein the first semiconductor device to the fourth semiconductor device configured to share a resistor for impedance matching, wherein the first semiconductor device to the fourth semiconductor device are coupled to have a chain shape, wherein the forth semiconductor device generates a completion signal when performance is completed and the first semiconductor device receives the completion signal provided from the fourth semiconductor device.

In an embodiment, a system may be provided. The system may include a first semiconductor device to an eighth semiconductor device, wherein the first semiconductor device to the eighth semiconductor device are configured to share a resistor for impedance matching, wherein first semiconductor device to the eighth semiconductor device are coupled to have a chain shape, wherein the eighth semiconductor device generates a completion signal when performance is completed and the first semiconductor device receives the completion signal provided from the eighth semiconductor device.

In an embodiment, a system may be provided. The system may include a first semiconductor device to an sixteenth semiconductor device, wherein the first semiconductor device to the sixteenth semiconductor device configured to share a resistor for impedance matching, wherein the first semiconductor device to the sixteenth semiconductor device are coupled to have a chain shape, wherein the sixteenth semiconductor device generates a completion signal when performance is completed and the first semiconductor device receives the completion signal provided from the sixteenth semiconductor device.

In an embodiment, a system may be provided. The system may include a first semiconductor device to a thirty-second semiconductor device, wherein the first semiconductor device to the thirty-second semiconductor device is configured to share a resistor for impedance matching, wherein the first semiconductor device to the thirty-second semiconductor device are coupled to have a chain shape, wherein the thirty-second semiconductor device generates a completion signal when performance is completed and the first semiconductor device receives the completion signal provided from the thirty-second semiconductor device.

In an embodiment, a system may be provided. The system may include a first semiconductor device, a second semiconductor device, a third semiconductor device and a fourth semiconductor device, wherein the first semiconductor device to the fourth semiconductor device are configured to share a resistor for impedance matching, wherein the first semiconductor device to the fourth semiconductor device are coupled to have a chain shape, wherein at least one of the first semiconductor device to the fourth semiconductor device includes a volatile memory and at least one of the first semiconductor device to the fourth semiconductor device includes a non-volatile memory.

In an embodiment, a semiconductor device may be provided. The semiconductor device may include various types of memories, an interface configured to transmit memory characteristic information of the memories to a host, receive information needed to control operations of the memories from the host, and perform interfacing between the host and the memories and a controller configured to control operations of the memories in response to information received from the host, and control an operation of the interface, wherein the controller further includes: a storage circuit configured to store the memory characteristic information generated for each channel and an AC parameter generated for each memory on the basis of the memory characteristic information.

In an embodiment, a semiconductor device may be provided. The semiconductor device may include a controller configured to store memory characteristic information regarding various types of memories, and output a control signal corresponding to the stored information and an interface configured to perform interfacing between a host and the various types of memories, and control operation modes of the various types of memories in response to the control signal, wherein the controller further includes: a storage circuit configured to store the memory characteristic information generated for each channel and an AC parameter generated for each memory on the basis of the memory characteristic information.

In an embodiment, a memory system may be provided. The memory system may include a plurality of memory devices, a controller configured to control operations of the memory devices, and a plurality of temperature sensors arranged in the memory devices and the controller, and in any specific peripheral region of the memory devices and the controller, and configured to sense temperature information. The controller may control operations of the memory devices in response to the temperature information sensed by the temperature sensors.

In an embodiment, a memory system may be provided. The memory device includes a plurality of memory devices, and a power management integrated circuit (PMIC) configured to manage a power source applied to the plurality of memory devices in response to a power control signal and an input power source, and coupled to a battery module.

In an embodiment, a memory system may be provided. The memory system may include a memory module configured to include a plurality of memory devices and a controller controlling the plurality of memory devices, a power management integrated circuit (PMIC) configured to manage a power source applied to the plurality of memory devices in response to a power control signal and an input power source, and a memory controller configured to control operations of the memory module, and generate the power control signal in response to residual storage capacity information of a battery module.

In an embodiment, a memory system may be provided. The memory system may include a memory module configured to include a plurality of memory devices and a controller controlling the plurality of memory devices, a power management integrated circuit (PMIC) configured to manage a power source applied to the plurality of memory devices in response to a power control signal and an input power source, a memory controller configured to control operations of the memory module, and generate the power control signal, and a register contained in each of the memory module, the power management integrated circuit (PMIC), and the memory controller, and configured to store characteristic information of the plurality of memory devices.

BRIEF DESCRIPTION OF THE DRAWINGS

FIG. 8 is a diagram illustrating an example of a packet structure transmitted/received between a memory controller and a media controller illustrated in FIG. 7.

DETAILED DESCRIPTION

In a controller and a memory device including the same according to various embodiments, it may be possible to perform different types of operation control on the basis of an access unit according to the types of memory.

In a controller and a memory device including the same according to various embodiments, new internal commands may be generated on the basis of an access unit decided according to the types of memory, so that it may be possible to control operations for a plurality of memories.

In a controller and a memory device including the same according to various embodiments, operations are controlled with respect to a plurality of memories on the basis of an access unit and data and error correction codes that are separately controlled, so that it may be possible to associate operations between a host using different error correction schemes and the plurality of memories with one another.

According to various embodiments, in the controller and the memory device including the same, it may be possible to control operations according to different access units of memories. Since the controller internally controls operations according to the various types of the memory, for example, since a host does not need to generate different commands according to the access unit of the memories, operation efficiency can be improved.

Furthermore, according to various embodiments, in the controller and the memory device including the same, even when an error correction unit of a host is different from error correction units of memories, operations may be controlled according to an access unit, so that it may be possible to allow data provided through different error correction schemes and error correction codes associated with the data to be compatible with each other. Consequently, data is written in a plurality of memories or data is read from the plurality of memories and an error correction operation is performed, so that operation reliability may be improved.

Hereinafter, a controller and a memory device including the same will be described below with reference to the accompanying drawings through various examples of embodiments.

Figure 1:
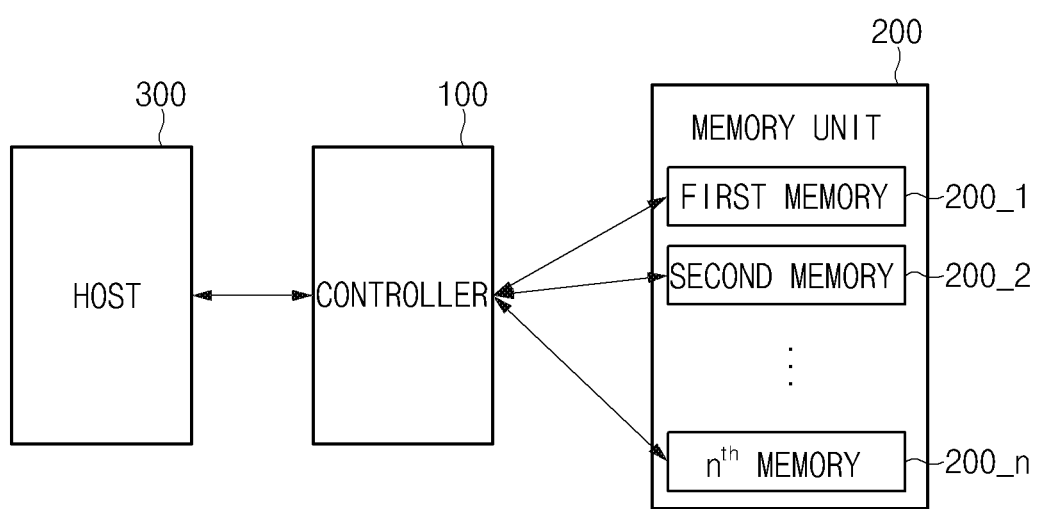
FIG. 1 is a block diagram illustrating a representation of an example of a memory device including a controller according to an embodiment.

FIG. 1 is a block diagram illustrating a representation of an example of a memory device including a controller according to an embodiment.

Referring to FIG. 1, a memory device 1 may include a controller 100, a memory unit 200, and a host 300.

Although FIG. 1 illustrates the controller 100 separated from the memory unit 200 for convenience of description, the scope or spirit of the present disclosure is not limited thereto, and it should be noted that the controller 100 and the memory unit 200 can also be integrated into one module as necessary.

The controller 100 may perform a control operation such that operations of the memory unit 200 including a plurality of memories 200_1 to 200_n may be associated according to an error correction scheme of the host 300. The controller 100 generates an internal command from a command, which has been received from the host 300, on the basis of access units of the plurality of memories 200_1 to 200_n. The controller 100 may store the access units of the plurality of memories 200_1 to 200_n. In an embodiment, a signal may be transmitted or received to or from the host 300 and the plurality of memories 200_1 to 200_n in a protocol format.

The controller 100 may include controllers 100 and 100a which will be described with reference to FIG. 2 and FIG. 6.

The memory unit 200 may include the plurality of memories 200_1 to 200_n. The plurality of memories 200_1 to 200_n may have form factors different from another, respectively. For example, the form factor of the first memory 200_1 may correspond to M1, the form factor of the second memory 200_2 may correspond to M2, and the form factor of the $n^{th}$ memory 200_n may correspond to Mn.

Burst lengths of the plurality of memories 200_1 to 200_n, which are written or read at a one-time time point, may be different from one another. For example, the burst length of the first memory 200_1 may correspond to BL1, the burst length of the second memory 200_2 may correspond to BL2, and the burst length of the $n^{th}$ memory 200_n may correspond to BLn.

A unit in which each memory may be accessed at a one-time time point, that is, an access unit may correspond to a value obtained by multiplying the form factor by the burst length. For example, the access unit C1 of the first memory 200_1 may correspond to M1×BL1, the access unit C2 of the second memory 200_2 may correspond to M2×BL2, and the access unit Cn of the $n^{th}$ memory 200_n may correspond to Mn×BLn.

Since access units for the memories 200_1 to 200_n may be different from one another, the controller 100 needs to manage data, which has been received from the host 300, or data, which has been requested from the host 300, to be written or read according to different operation cycles on the basis of the access units of the memory 200_1 to 200_n.

The host 300 may exchange signals with the controller 100 in the form of packets. For example, the host 300 and the controller 100 may transmit/receive signals through an abstracted protocol.

In the abstracted protocol, signals may be transmitted/received at a non-deterministic timing, and the host 300 may transmit data and commands to the controller 100 regardless of the type (or characteristics or access units) of the plurality of memories 200_1 to 200_n.

On the basis of data and commands received from the host 300 and the characteristics of various memories 200_1 to 200_n of the memory unit 200, the controller 100 may process the data and the commands and provide them.

When data is transmitted and received among the host 300, the controller 100, and the memory unit 200, an error correction code may be provided in order to ensure the reliability of data.

Data and the size of the error correction code based on the data may be decided according to an error correction scheme or the operation characteristics of a memory. For example, when the host 300 uses an error correction scheme of a SECDED (Single Error Correction Double Error Detection) of 64-8 bits, data of 64 bits and an error correction code of 8 bits may be transmitted in a one-time write command.

The plurality of memories 200_1 to 200_n included in the memory unit 200 may operate according to data received from the host 300 and a ratio different from to a preset ratio of the error correction code. Accordingly, in order to associate operations between the host 300 and the memory unit 200 with one another, the controller 100 generates an internal command on the basis of an access unit of the memory unit 200.

According to an embodiment, in a write operation, the controller 100 may temporarily store an error correction code received from the host 300, and may write only reception data in the memory unit 200 on the basis of an access unit. In a read operation, the controller 100 may read data from the memory unit 200 on the basis of the access unit and transmit the data to the host 300 together with the already stored error correction code.

In another embodiment, the controller 100 may also write an error correction code in one or more memories selected from the memory unit 200 together with reception data from the host 300. On the basis of the capacity of a memory of the memory unit 200 in which the reception data is written, the error correction code may be written in the memory or stored only in the controller 100.

In an embodiment, the controller 100 may separately write reception data and an error correction code in the plurality of memories included in the memory unit 200. The error correction code written in the memory may be decided according to the size of the reception data. For example, reception data from the host 300 may be 512 bits and the error correction code may be 64 bits. The controller 100 may write 256 bits of the reception data from the host 300 in the first memory 200_1 and write the remaining 256 bits in the second memory 200_2. In this case, when the first memory 200_1 or the second memory 200_2 has an error correction function and a storage space, an error correction code of 32 bits may be written together with the data.

On the basis of error correction code received from the controller 100, the memory unit 200 may internally perform a separate error correction operation. In a read operation, the controller 100 may read data and the error correction code from the memory unit 200 and transmit the data and the error correction code.

In the case of writing data and/or an error correction code in the memory unit 200 or reading the data and/or the error correction code from the memory unit 200, the controller 100 should generate an internal command according to the access units of the memory 200_1 to 200_n included in the memory unit 200.

Accordingly, in the case of a write operation, the controller 100 may compare the size of data received from the host 300 with the access units of the memories 200_1 to 200_n included in the memory unit 200. On the basis of the comparison result, the controller 100 may generate an internal command such that the data (together with an error correction code when a memory selectively has an error correction function and an ensured storage space) received from the host 300 is written in one or more memories 200_1 to 200_n included in the memory unit 200 during one or more cycles.

When the size of the reception data from the host 300 is larger than the access units of the memories 200_1 to 200_n, the controller 100 may generate an internal command such that a write operation is performed for one or more of the plurality of memories 200_1 to 200_n through a repetitive write operation of a plurality of times.

The operation for comparing the size of the reception data with the access units of the memories 200_1 to 200_n may be performed in the controller 100. The controller 100 compares the access units of one or more of the memories 200_1 to 200_n included in the memory unit 200 with the size of the reception data. According to an embodiment, the controller 100 may compare the access units of all the memory 200_1 to 200_n included in the memory unit 200 with the size of the reception data.

When the size of the reception data from the host 300 is larger than the access units, the controller 100 may transfer the data received from the host 300 to the memory unit 200 through a write cycle corresponding to an integer value obtained by rounding up a value obtained by dividing the size of the reception data by the access units.

When the size of the reception data from the host 300 is less than or equal to the access units, the controller 100 may transfer the reception data to the memory unit 200 through a one-time write cycle.

In the case of a read operation, the controller 100 may receive a command for reading a specific size of data from the host 300. In the present specification, data requested to be read from the memory unit 200 by the host 300 is called 'request data'.

The controller 100 compares the size of the request data with the access units of one or more of the memories 200_1 to 200_n included in the memory unit 200. When the size of the request data is larger than the access units on the basis of comparison information CPR, the controller 100 may generate an internal command for reading read data through a repetitive read cycle of a plurality of times. When the size of the request data is less than or equal to the access units on the basis of comparison information CPR, the controller 100 may read data through a one-time write cycle.

According to an embodiment, when the size of the request data is excessively larger than the access units, since the controller 100 repeatedly generates an internal command and reads the request data, it may not be efficient in terms of an operation. Accordingly, as a comparison result of the size of the request data and the access units, when a cycle exceeding a preset value is required, the controller 100 may transmit a read failure signal indicating that a read operation is not possible to the host 300, thereby allowing the host 300 to request a smaller size of request data.

Similarly to the write operation, also in the read operation, data provided from the host 300 may also include data and an error correction code.

As described above, a command of the read or write operation from the host 300 and the size of data requested for the command may be provided to the controller 100 regardless of the access units of the plurality of memories 200_1 to 200_n.

On the basis of the access units of the memories 200_1 to 200_n, the controller 100 may write reception data from the host 300 in the memory unit 200 through one or more cycles or read the request data requested by the host 300 from the memory unit 200.

In order to associate characteristics, which are provided by the ratio of data and an error correction code specified by the host 300 with the access unit of the memory unit 200, the controller 100 may separately manage data and an error correction code. As described above, the controller 100 may separately store only the error correction code therein or may write an error correction code corresponding to the data written in the memory unit 200.

According to an embodiment, when the memory 200_1 to 200_n included in the memory unit 200 include error correction logics, the memory 200_1 to 200_n may also internally perform an on-die ECC (error correction code) operation for performing an error correction operation on the basis of an error correction code provided from the host 300.

In an embodiment, the controller 100 may not only transfer an error correction code between the host 300 and the memory unit 200, but may also directly generate error correction information on request data read from the memory unit 200 by using an error correction circuit included therein and correct an error, or receive error-corrected information from the memory unit 200 and transfer the received information to the host 300.

Figure 2:
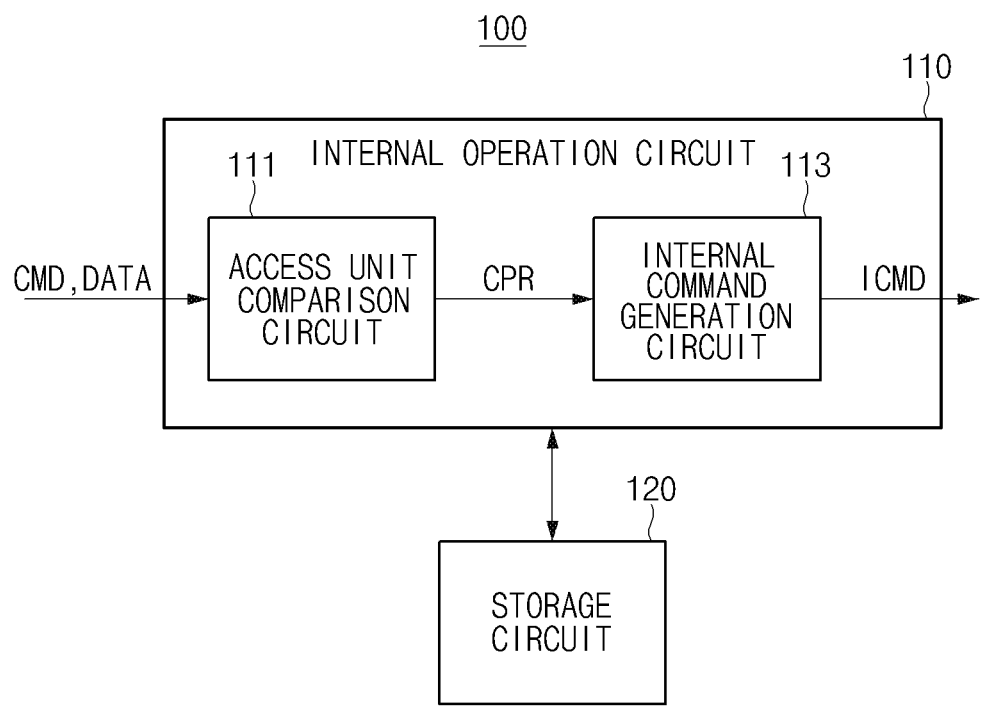
FIG. 2 is a block diagram illustrating a representation of an example of a controller according to an embodiment.

FIG. 2 is a block diagram illustrating a representation of an example of a controller according to an embodiment.

Referring to FIG. 2, a controller 100 may include an internal operation circuit 110 and a storage circuit 120. The internal operation circuit 110 may generate an internal command ICMD on the basis of the access unit (for example, Cn) of the plurality of memories 200_1 to 200_n included in the memory unit 200 of FIG. 1.

The controller 100 may include the storage circuit 120 that stores information on the access unit of the plurality of memories 200_1 to 200_n. According to an embodiment, when the controller 100 stores an error correction code PRT received from the host 300, the storage circuit 120 may store the error correction code PRT and then provide the error correction code PRT together with data in the case of providing an exterior with data corresponding to the error correction code PRT. The storage circuit 120 may also perform a function in which the controller 100 temporarily stores data.

The internal operation circuit 110 may include an access unit comparison circuit 111 and an internal command generation circuit 113.

The access unit comparison circuit 111 compares the size of reception data from the host 300 with the access unit of the memories 200_1 to 200_n in the case of a write operation, and compares the size of request data from the host 300, for example, the size of data commanded to be read from the memory unit 200 by the host 300, with the access unit and generates comparison information CPR.

The comparison information CPR may include a value obtained by dividing the size of the reception data from the host 300 or the size of the request data from the host 300 by the access unit. For example, the comparison information CPR may include a value obtained by dividing the size of the reception data or the request data by the access unit and rounding up the numerals after the decimal point.

When the size of the reception data or the size of the request data is larger than the access unit, the comparison information CPR may correspond to a value exceeding 1 or an integer value equal to or more than 2.

When the size of the data received from the host 300 or the size of the data requested to be read by the host 300 is less than or equal to the access unit, the comparison information CPR may correspond to a value less than or equal to 1.

According to an embodiment, the access unit comparison circuit 111 may compare the reception data or the request data with the access units of all the memory 200_1 to 200_n included in the memory unit 200, and may the generate the comparison information CPR. In an embodiment, when an access unit of a preset number of memories is larger than the reception data or the request data, the access unit comparison circuit 111 may stop a comparison operation.

The internal command generation circuit 113 generates an internal command ICMD on the basis of the comparison information CPR received from the access unit comparison circuit 111. The internal command generation circuit 113 may generate the internal command ICMD for performing a write operation or a read operation through one or more cycles on the basis of the comparison information CPR.

For example, when the size of data received from the host 300 is larger than the access unit of the memories 200_1 to 200_n included in the memory unit 200, the internal command generation circuit 113 may generate the internal command ICMD such that a write operation is performed through a repetitive operation of a plurality of times.

The access unit for the memories 200_1 to 200_n has been decided, but the host 300 may transmit a write command regardless of the access unit of the memories 200_1 to 200_n. Accordingly, the internal command generation circuit 113 included in the controller 100 generates the internal command ICMD such that data is written according to the access unit of the memories 200_1 to 200_n.

Furthermore, in order to match a ratio of data, which is transmitted from the host 300 or should be provided to the host 300, and an error correction code based on the data, when only data is written in the memory unit 200 and an error correction code is separately managed by the controller 100 or data is written in the memory unit 200 during several cycles and a memory with written data of the memory unit 200 has an error correction logic, the controller 100 may write an error correction code by different values according to the written data.

In an operation in which data is written in the memory unit 200 through the controller 100, even though data is written during cycles of a plurality of times, data may be written only in one memory selected in the memory unit 200 or data may be separately written in several memories.

A command CMD provided from the host 300 may include information for allowing data to be written only in a specific memory of the memory unit 200 or information for allowing data to be distributed and written in several memories.

Furthermore, according to an embodiment, data may be written in the memory unit 200 according to a scheme set in the controller 100. For example, the controller 100 includes information on the access unit and the like of the memories 200_1 to 200_n included in the memory unit 200, wherein the information may allow data to be firstly written in a memory having a large access unit, data to be firstly written in a physically adjacent memory, or data to be preferentially written according to a preset priority. Furthermore, an operation, in which data is written only in one memory or data is distributed and written in several memories, may also be performed in different schemes according to an embodiment.

Figure 3:
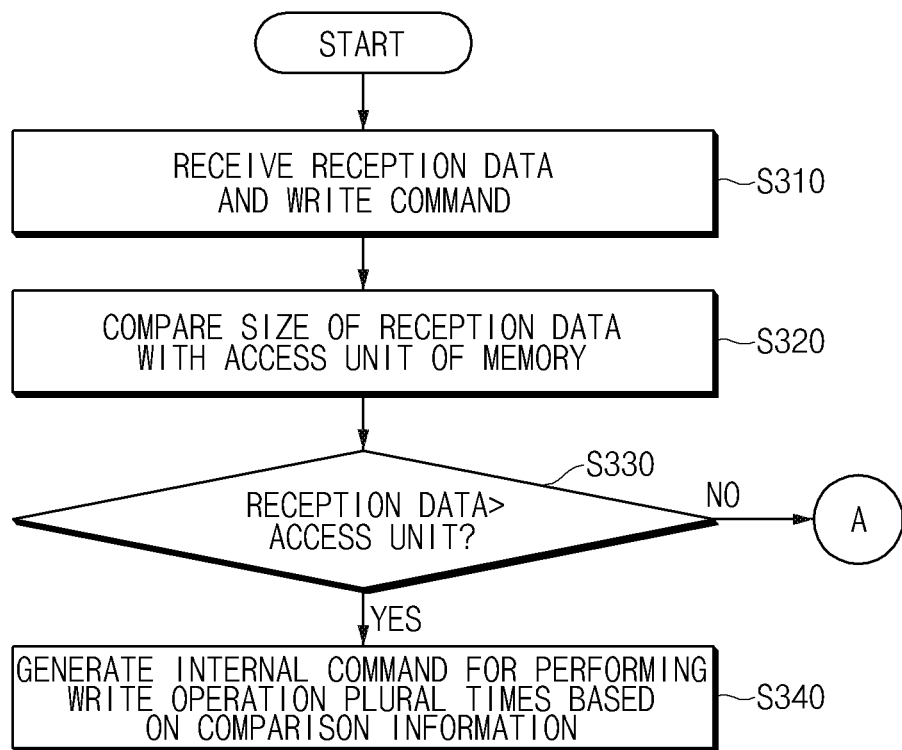
FIG. 3 is a flowchart for explaining a representation of an example of a write operation of a controller according to an embodiment.

FIG. 3 is a flowchart for explaining a representation of an example of the write operation of the controller according to an embodiment.

Referring to FIGS. 1 to 3, the controller 100 may receive reception data, an error correction code, and a write command from the host 300 (step S310). The host 300 may provide the reception data and the error correction code with a size having a predetermined ratio. Furthermore, the write command may include an address specified by the host 300. The controller 100 may map the address included in the command with an address of the memory unit 200 and store the mapped address.

The controller 100 compares the size of the reception data with the access units of the plurality of memories 200_1 to 200_n constituting the memory unit 200 (step S320). According to an embodiment, the controller 100 may compare the access units of all the plurality of memories 200_1 to 200_n with the size of the reception data or access units of some of the plurality of memories 200_1 to 200_n with the size of the reception data.

When the size of the reception data is larger than the access units (Yes of step S330), the controller 100 may generate an internal command for performing a write operation a plurality of times (step S340). The case in which the size of the reception data is less than or equal to the access units (No of step S330) will be described with reference to FIG. 4.

As described with reference to FIG. 1 and FIG. 2, the access unit comparison circuit 111 included in the controller 100 may round up a value obtained by dividing the reception data by the access unit or a divided value, and provide the comparison information CPR.

Accordingly, when the size of the reception data is larger than the access units, the comparison information CPR may be a number larger than 1 or an integer larger than 2. The internal command generation circuit 113 may generate an internal command for performing a write operation, which is repeated by an integer included in the comparison information CPR, on the basis of the access units of the memories 200_1 to 200_n included in the memory unit 200. Furthermore, the internal command generation circuit 113 may also divide the reception data according to the access units, load the data on the internal command, and transmit the internal command to the memory unit 200.

For example, when the size of the reception data is N bits and the access units of the plurality of memories 200_1 to 200_n included in the memory unit 200 respectively correspond to C1 to Cn, the comparison information CPR may correspond to a value obtained by dividing N by one or more of C1 to Cn and may be realized such that the N bits includes a combination (for example, N=C1+C2+C3, N=C1+Cn, and the like) of C1 to Cn as a whole.

The internal command generation circuit 113 may divide the reception data according to the access units, load the data on an internal command of a plurality of times, and transmit the internal command to the memory 200_1 to 200_n included in the memory unit 200.

In an embodiment, the internal command generation circuit 113 may write an error correction code in the memory unit 200 as well as the reception data. When a memory with written data includes an error correction logic, the internal command generation circuit 113 may transmit an error correction code corresponding to the data written in the memory to the memory. When the memory with the written data includes no error correction logic, the error correction code may be stored in the storage circuit 120 provided in the controller 100.

Figure 4:
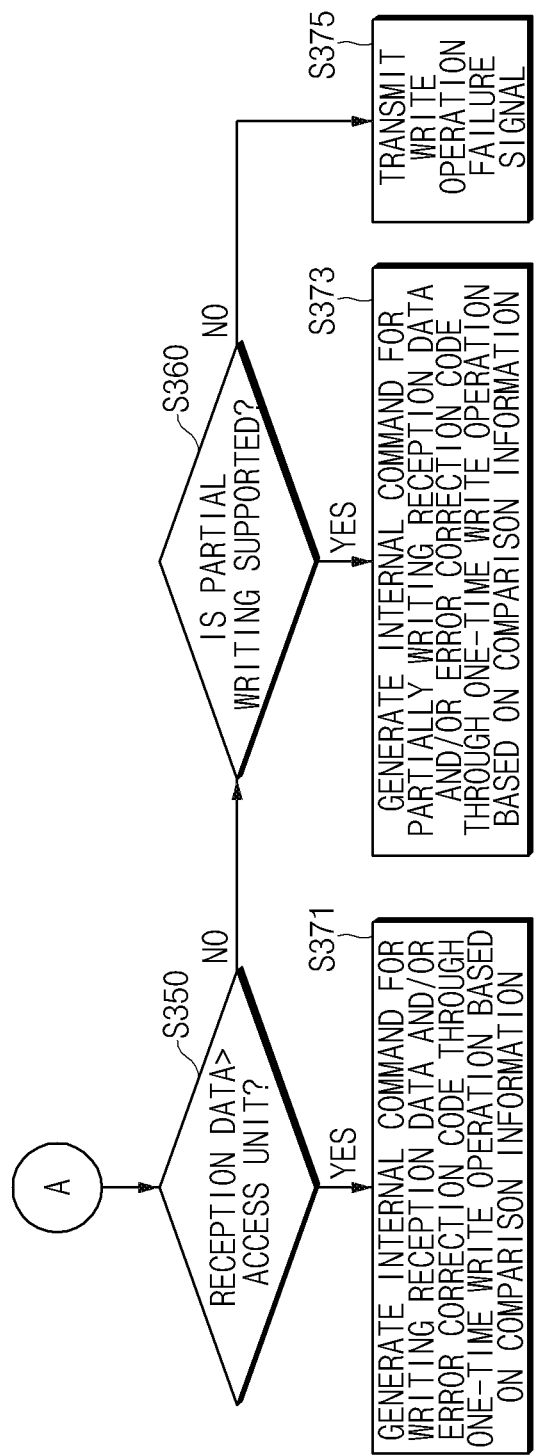
FIG. 4 is a flowchart for explaining the case in which the size of reception data is less than or equal to an access unit in a write operation according to an embodiment.

The case in which the size of the reception data is less than or equal to the access units will be described with reference to FIG. 4. FIG. 4 is a flowchart for explaining the case in which the size of the reception data is less than or equal to the access units in the write operation according to an embodiment.

Referring to FIG. 4, the access unit comparison circuit 111 determines whether the size of the reception data is equal to the access units (step S350). When the size of the reception data is equal to the access units (Yes of step S350), the access unit comparison circuit 111 may provide the internal command generation circuit 113 with the comparison information CPR indicating that the size of reception data is equal to the access units.

The internal command generation circuit 113 may generate a write command capable of writing the reception data in the memory unit 200 through a one-time write operation (step S371). According to an embodiment, the reception data and an error correction code may also be written in the memory unit 200 at a time.

When the size of the reception data is not equal to the access units (No of step S350), the reception data may be less than the access units. In such a case, some reception data of the access units may be written only when the memories 200_1 to 200_n included in the memory unit 200 should support partial writing.

Whether the memory 200_1 to 200_n included in the memory unit 200 support the partial writing may be determined on the basis of information stored in the storage circuit 120. Some memories included in the memory unit 200 support the partial writing (Yes of step S360), the internal command generation circuit 113 may generate an internal command for partially writing the reception data and/or an error correction code in a memory supporting the partial writing through a one-time write operation (step S373).

When any memories included in the memory unit 200 do not support the partial writing (No of step S360), since the reception data may not be written in the memory unit 200, the access unit comparison circuit 111 may transmit a write operation failure signal to the host 300 (step S375).

Figure 5:
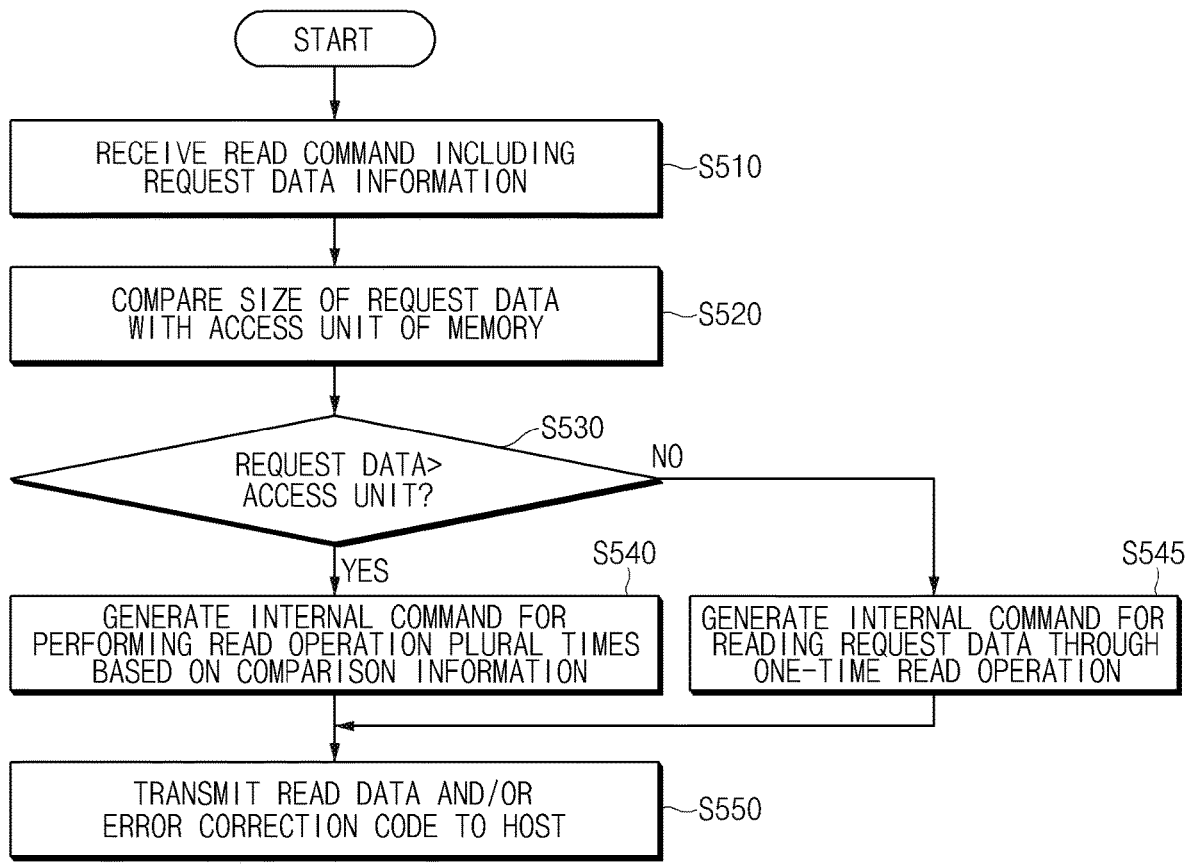
FIG. 5 is a flowchart for explaining a representation of an example of a read operation of a controller according to an embodiment.

FIG. 5 is a flowchart for explaining a representation of an example of the read operation of the controller according to an embodiment.

Referring to FIGS. 1, 2, and 5, the controller 100 receives a read command including request data information from the host 300 (step S510). The request data information may include the size of request data and an address of the request data.

The access unit comparison circuit 111 compares the size of the request data with the access units (step S520). When the size of the request data is larger than the access units (Yes of step S530), it is not possible to read request data written in a memory through a one-time read operation. Accordingly, the request data should be read a plurality of times.

The access unit comparison circuit 111 provides comparison information CPR to the internal command generation circuit 113. On the basis of the comparison information CPR, the internal command generation circuit 113 generates an internal command for performing a read operation a plurality of times (step S540). According to an embodiment, the internal command generation circuit 113 may map an address provided from the host 300 into an address written in the memory unit 200, generate address information again, and put the address information into an internal command ICMD.

The controller 100 may read the request data a plurality of times according to the generated internal command and transmit the read data to the host 300. According to an embodiment, an error correction operation may be performed in the memory unit 200 and data may be provided to the controller 100, or an error correction code stored in the controller 100 may be transmitted to the host 300 together with the read data.

When the size of the request data is less than or equal to the access units (No of step S530), the access unit comparison circuit 111 provides the internal command generation circuit 113 with comparison information CPR indicating that the size of the request data is less than or equal to the access units.

When the size of the request data is less than the access units, the request data may be sufficiently read through a one-time read operation. Accordingly, the internal command generation circuit 113 generates an internal command ICMD for reading the request data through a one-time read operation (step S545).

Similarly, the controller 100 may transmit the data read through the internal command to the host 300, and may selectively provide an error correction code to the host 300 (step S550).

According to an embodiment, on the basis of the request data information included in the read command received from the host 300, the controller 100 may determine the case in which reading of the request data within a preset time is not possible and transmit a failure signal to the host 300. The preset time may be set in the controller 100 in advance or may be included in the read command provided to the controller 100 from the host 300.

Figure 6:
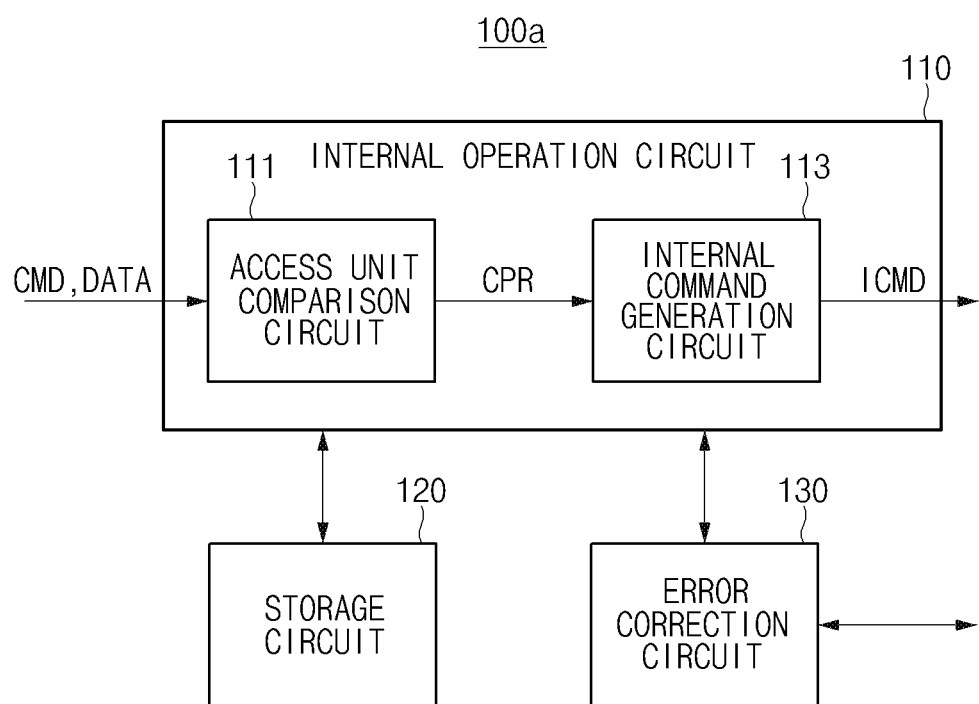
FIG. 6 is a block diagram illustrating a representation of an example of a controller according to an embodiment.

FIG. 6 is a block diagram illustrating a representation of an example of a controller according to an embodiment.

Referring to FIG. 6, a controller 100a (i.e., see FIG. 2) may further include an error correction circuit 130. The error correction circuit 130 may generate error correction information with respect to data read from the memory unit 200 (i.e., see FIG. 1). For example, in a read operation, the error correction circuit 130 may generate the error correction information with respect to the request data read from the memory unit 200, or when an error correction command is provided from the host 300, the error correction circuit 130 may read data from the memory unit 200 to correct an error and write error-corrected data in the memory unit 200 again.

The controller 100a may further include the error correction circuit 130, thereby performing an error correction function separately from the host 300 and the memory unit 200.

In the controller according to an embodiment and the memory device including the same, in order to execute a command provided from the host without considering the characteristics of a plurality of memories, it may be possible to generate an appropriate internal command according to access units of the plurality of memories. Consequently, it may be possible to associate operations between the plurality of memories and the host with each other, and in order to associate an error correction code, which should be provided from the host while having a predetermined ratio, with operations among the plurality of memories, the error correction code is separately managed.

Figure 7:
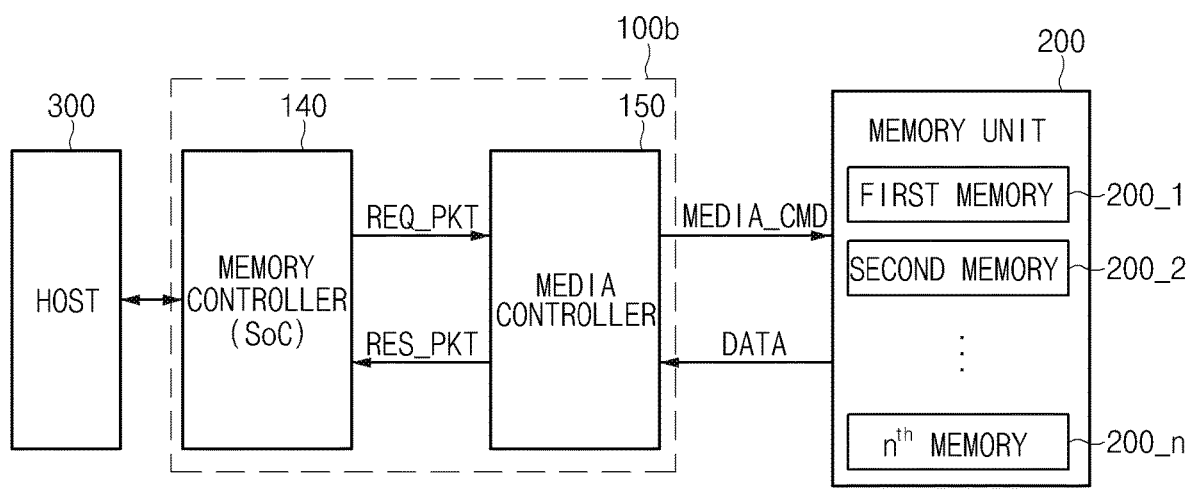
FIG. 7 is a diagram illustrating an example of a data storage apparatus according to an embodiment of the present disclosure.

FIG. 7 is a diagram illustrating an example of a data storage apparatus according to an embodiment of the present disclosure.

Referring to FIG. 7, the data storage apparatus may include a controller 100b, a memory unit 200 and a host 300. The controller 100b may include a memory controller 140 and a media controller 150.

The memory controller 140 may communicate with the media controller 150 according to a predetermined protocol so as to control data read and write operations for a memory unit 200. For this purpose, the memory controller 140 may transmit a request packet (e.g., packetized request signal) REQ_PKT to the media controller 150 using an abstracted protocol provided between the media controller 150 and the memory controller 140, and may then receive a response packet (e.g., packetized response signal) RES_PKT from the media controller 150. For example, the memory controller 140 may transmit and receive a packetized signal having the same structure as FIG. 8 to and from the media controller 150 according to non-deterministic timing points. As described above, the memory controller 140 may communicate with only the media controller 150. Even if the memory unit 200 includes different types of memories 200_1 to 200_n having different latency variations, the memory controller 140 may control data read/write operations being performed on the plurality of memories 200_1 to 200_n using only one protocol provided between the memory controller 140 and the media controller 150. In addition, even if the memory controller 140 and the memory unit 200 have different data processing speeds, the memory controller 140 may communicate with the media controller 150, not according to the processing capability of the memory unit 200, but according to the processing capability of the memory controller 140. The memory controller 140 may be a part of a host device. The memory controller 140 may be a part of a System on Chip (SoC).

The media controller 150 is coupled between the memory controller 140 and the memory unit 200, and may communicate with each of the memory controller 140 and the memory unit 200 according to a predetermined protocol. The media controller 150 may generate a media command MEDIA_CMD in response to the request packet REQ_PKT from the memory controller 140, and may read or write data by accessing the corresponding address of the memory unit 200 using the media command MEDIA_CMD. That is, the media controller 150 may transmit and receive packetized signals to and from the memory controller 140 using the abstracted protocol, and may generate the media command MEDIA_CMD appropriate for physical layers (PHY) and protocols of the respective memories 200_1 to 200_n. The media controller 150 may access the memory unit 200 using the generated media command MEDIA_CMD. For example, In response to the request packet REQ_PKT provided from the memory controller 140, the media controller 150 may determine, using information contained in the request packet REQ_PKT, which request (e.g., write request or read request) is associated with the corresponding packet, and may also determine which one of the memories 200_1 to 200_n contained in the memory unit 200 needs to be accessed so as to perform the request. The media controller 150 may generate a media command for the memory to be accessed (e.g., a command appropriate for a PHY and a protocol of the memory to be accessed), and may perform the data read or write operation on the memory unit 200. In an embodiment, the memories 200_1 to 200_n of the memory unit 200 may be different kinds of memory components having different latency variations. If a long latency occurs in a target memory (e.g., 200_1), the media controller 150 may store all or some parts of the write data in at least one of the other memories (e.g., 200_2 and 200_n), and may inform the memory controller 140 of information regarding the stored parts of the write data. For example, if a tag of a new write request packet (i.e., a current write request packet) received during a data write mode by the media controller 150 is identical to at least one of the tags of the write request packets (i.e., standby or queued write request packets) that have already been received by the media controller 150 and scheduled to be processed, the media controller 150 may hold the current write request packet without processing it, and then the media controller 150 may change an address of the current write request packet to another address, may store data in a changed position corresponding to the changed address, and may inform the memory controller 140 of information regarding the changed position. In addition, when the media controller 150 transmits the response packet RES_PKT to the memory controller 140 in response to the request packet REQ_PKT, the media controller 150 may first determine whether target data the media controller 150 is sending is the data that had been stored in the changed position because the tags of the newly received write request packet and a previously received write request packet were identical to each other. If the target data is identical to the storage-position-changed data (i.e., address-changed data), the media controller 150 may insert information indicating the change in address and data storage position into the response packet RES_PKT, and may transmit the resultant response packet RES_PKT to the memory controller 140.

The memory controller 300 may read or write data DATA in response to the media command MEDIA_CMD provided from the media controller 150. The memory unit 200 may include different kinds of memories 200_1 to 200_n having different latency variations. In this case, each of the memories 200_1 to 200_n may be a volatile memory or a non-volatile memory.

Figure 8:
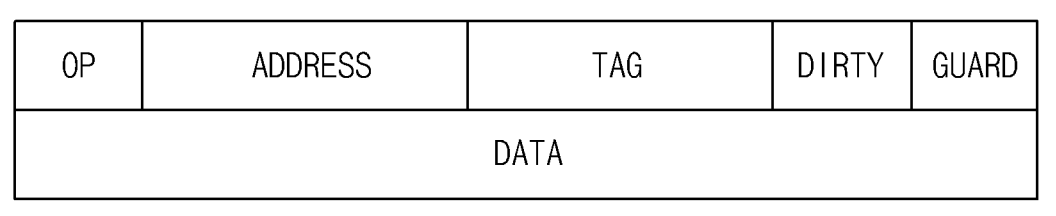

FIG. 8 is a diagram illustrating an example of a packet structure transmitted/received between the memory controller 140 and the media controller 150 illustrated in FIG. 7.

Referring to FIG. 8, the packet may include an OP field OP, an address field ADDRESS, a tag field TAG, a dirty field DIRTY, a guard field GUARD, and a data field DATA.

The OP field OP may include information (e.g., OP code) indicating a packet type. In other words, the OP field may include information for identifying whether the corresponding packet is a packet for the read operation or a packet for the write operation.

The address field ADDRESS may include information regarding the position of the memory unit 200 from which data is scheduled to be read or the position of the memory unit 200 to which data of the memory unit 200 is scheduled to be written.

The tag field TAG may include identification information (e.g., tag) for distinguishing between packets. In order to create such a tag, a value independent of the address may be used. Alternatively, some parts of the address may be used as the tag or some parts of the tag. The number of bits contained in the tag field TAG may be equal to or less than the number of bits contained in the address field ADDRESS.

The data field DATA may include write data, read data, and information regarding changes (e.g., changed address information), etc. That is, if the packet is a write request packet, the data field DATA may include data to be written. If the packet is a read response packet, the data field DATA may include read data. If the packet is a write response packet, the data field DATA may include an acknowledgement signal ("ACK signal") or information regarding the ACK signal and an address changes according to whether or not the position of written data is changed.

The guard field GUARD may indicate a certain value indicating whether or not position change (i.e., address change) of written data is allowed. If the guard field GUARD is set to "1," this means that position change is disallowed. If the guard field GUARD is set to zero "0," this means that position change is allowed. The guard field GUARD value may be determined only by the memory controller 140. The media controller 150 and the memory unit 200 may be read-only devices.

The dirty field DIRTY may include a certain value indicating whether or not the address has been changed. For example, assuming that the tag of a newly received packet is identical to the tag of a queued packet, and thus data of the newly received packet is stored in a modified address instead of an original address, the media controller 150 may allocate the value of "1" to the dirty field DIRTY such that the dirty field DIRTY is set to "1."

Figure 9:
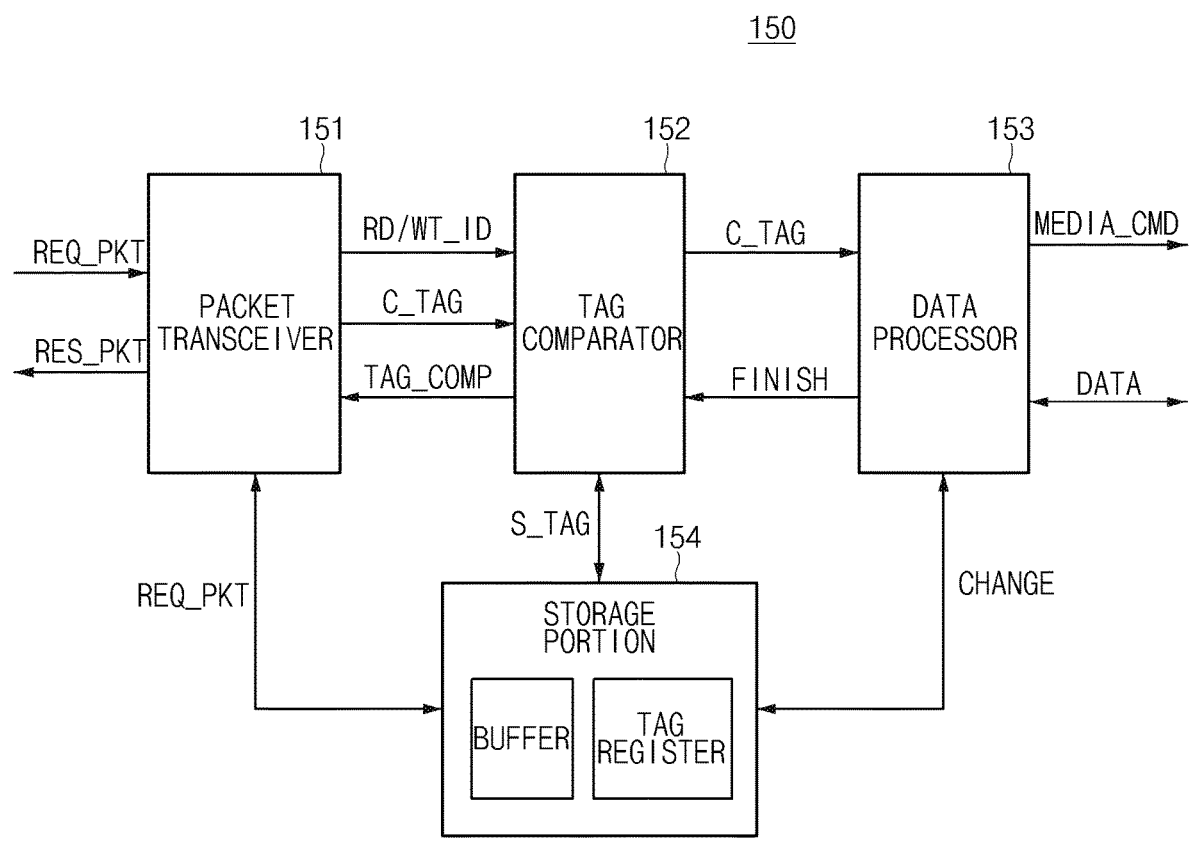
FIG. 9 is a diagram illustrating an example of the media controller illustrated in FIG. 7.

FIG. 9 is a diagram illustrating an example of the media controller 150 illustrated in FIG. 7.

Referring to FIG. 9, the media controller 150 may include a packet transceiver 151, a tag comparator 152, a data processor 153, and a storage portion 154. The packet transceiver 151 may communicate with the memory controller 140, such that a request packet REQ_PKT for reading or writing data and a response packet RES_PKT for responding to the request packet REQ_PKT are communicated between the packet transceiver 151 and the memory controller 140. That is, the packet transceiver 151 may receive the request packet REQ_PKT for the data read or write operation from the memory controller 140 according to a predetermined protocol, and may transmit the response packet RES_PKT responding to the request packet REQ_PKT to the memory controller 140.

In response to the request packet REQ_PKT provided from the memory controller 140, the packet transceiver 151 may determine, based on the OP code contained in the packet, whether the received request packet REQ_PKT is a request packet for the data read operation or a request packet for the data write operation, and may transmit read/write identification information RD/WT_ID indicating a determined result and tag information C_TAG to the tag comparator 152. Upon completion of the data write operation, the packet transceiver 151 may transmit, to the memory controller 140, the response packet RES_PKT containing an acknowledgment ACK message as a response to the write request. If the data storage position is changed because of a long latency of the accessed memory or because the previously received tag and a newly received tag are the same as each other, the packet transceiver 151 may insert associated information (e.g., information regarding the changed position, etc.) into the response packet RES_PKT, and may transmit the resultant response packet RES_PKT to the memory controller 140. In addition, upon completion of the data read operation, the packet transceiver 151 may insert read data in the response packet RES_PKT as a response to the read request, and may transmit the resultant response packet RES_PKT to the memory controller 140.

Specifically, assuming that data to be contained in the response packet RES_PKT has a changed storage position by address change because the previously received tag and a newly received tag are the same as each other, the packet transceiver 151 may change a dirty bit of the corresponding response packet RES_PKT to the value of "1" and may thus transmit the resultant response packet RES_PKT having the dirty bit of "1." In this case, the packet transceiver 151 may selectively change the dirty bit according to a tag comparison signal TAG_COMP received from the tag comparator 152.

The tag comparator 152 may compare the tag C_TAG of a current packet with tags S_TAG of the queued packets. In this case, the current packet may include the write request packet received from the current memory controller 140 and the response packet (e.g., read response packet or write response packet) to be transmitted to the memory controller 140. The queued packets may include packets that have changed their storage positions to other storage positions because they had the same tag as the tag in the write request packets queued in a buffer of the storage portion 154. Here, the queued write request packets are write request packets that have been received from the memory controller 140 and then scheduled to be processed.

The tag comparator 152 may compare tag information C_TAG contained in the write request packet currently received from the memory controller 140 with tag information S_TAG of the other write request packets queued in a buffer to wait their turns. If the tag information C_TAG of the currently received write request packet has the same tag as the tag information S_TAG of any of the queued write request packet, the tag comparator 152 may transmit the corresponding tag information C_TAG to the data processor 153. In addition, in response to a signal FINISH, which is provided from the data processor 153, indicating that the previous read operation has completed (or read data) or indicating that the previous write operation has completed, the tag comparator 152 may compare a tag of the corresponding response packet (current read response packet or current write response packet) with tag information stored in a tag register of the storage portion 154, and may transmit a signal TAG_COMP indicating the comparison result to the packet transceiver 151.

In response to the request packets REQ_PKT received from the memory controller 140, the data processor 153 may access the memory unit 200 according to the order of execution of program/read operations to perform the data read/write operations corresponding to the packets. In this case, when the data processor 153 accesses the memory unit 200, the data processor 153 may generate a media command MEDIA_CMD appropriate for a physical layer (PHY) and a protocol of each accessed memories 200_1 to 200_n, and may read or write data DATA according to the media command MEDIA_CMD.

During the data write mode, if a long latency occurs in the memory 200_1 accessed by the data processor 153, for example, if the data write time exceeds a predetermined threshold time, the data processor 153 may store all or some parts of the write data in at least one of the other memories (e.g., 200_2 to 200_n), and may store information (tag, original position, changed position, etc.) regarding the result stored in the storage portion 154.

Specifically, according to a first case, if the tag information C_TAG is received from the tag comparator 152 (if the packet has a tag whose information is the same as tag information C_TAG stored in the buffer), the data processor 153 may treat the packet as a faulty (or erroneous) packet, and the data processor 153 may put a hold on processing the faulty packet. Alternatively, according to a second case, after changing the address contained in the corresponding packet to either an address of a memory different from a target memory to be accessed or an address of the same memory as the target memory, the data processor 153 may access the changed address, store data therein, transmit information CHANGE associated with the stored data to the storage portion 154, and store the information CHANGE in the storage portion 154. In this case, information as to whether the packet having the same tag will be processed according to the first case or the second case may vary depending on how the tag is created.

If the read or write operation requested by each request packet REQ_PKT is completed, the data processor 153 may transmit, to the tag comparator 152, the signal indicating operation completion with respect to the corresponding packet.

The storage portion 154 may include a buffer and a tag register. In the buffer, a plurality of packets having been received from the memory controller 140 may be queued to be processed. The tag register may store tag information regarding packets that have changed their data storage positions because of the long latency or the tag conflict (e.g., a situation where the tag of the current request packet has the same tag as the tag of any of the queued request packet). In addition, the storage portion 154 may temporarily store data read by the data processor 153.

Figure 10:
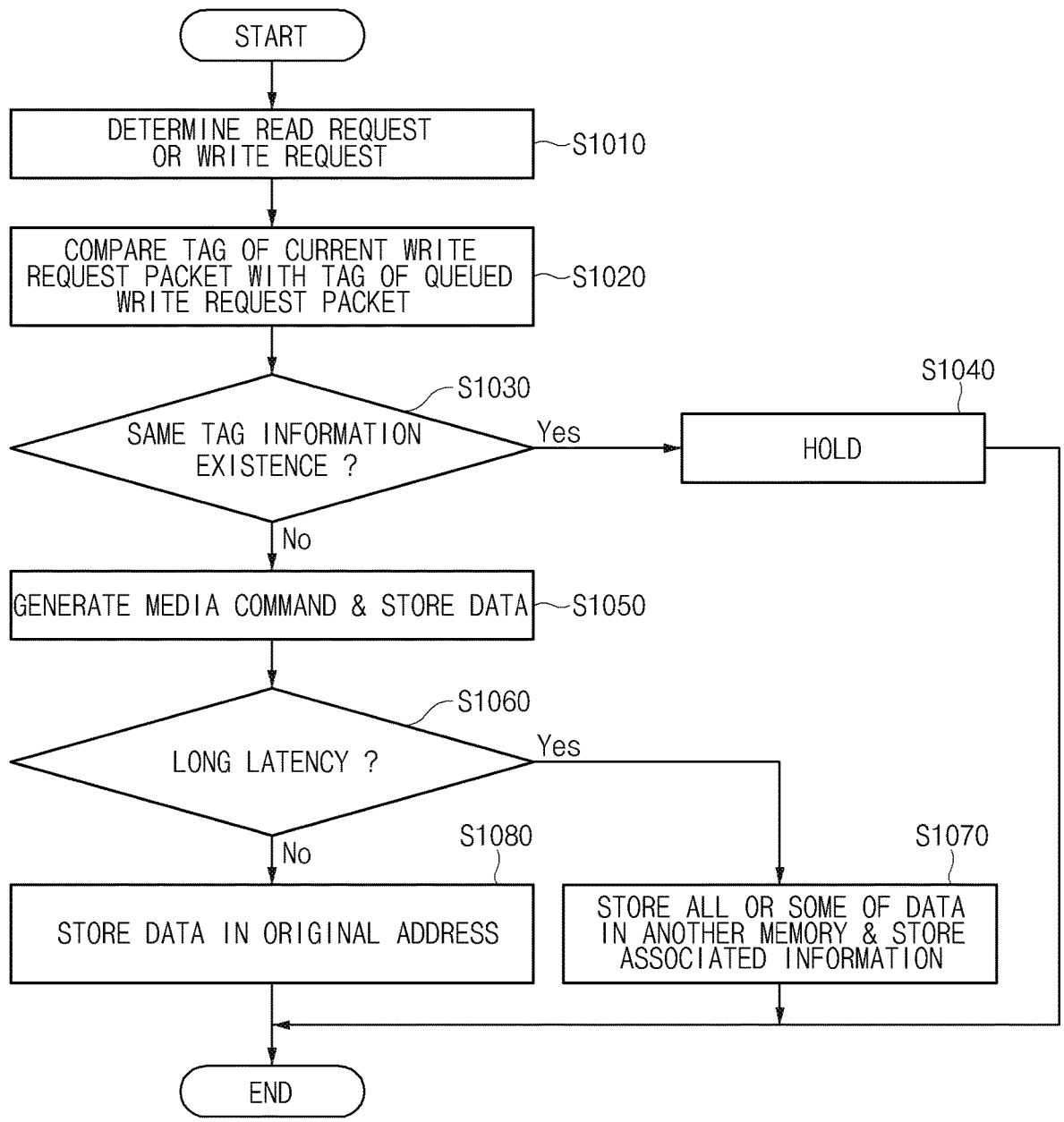
FIG. 10 is a flowchart illustrating an example of a data write process that may be used when a tag is completely separated from an address or when some parts of the address are used as the tag.
Figure 11:
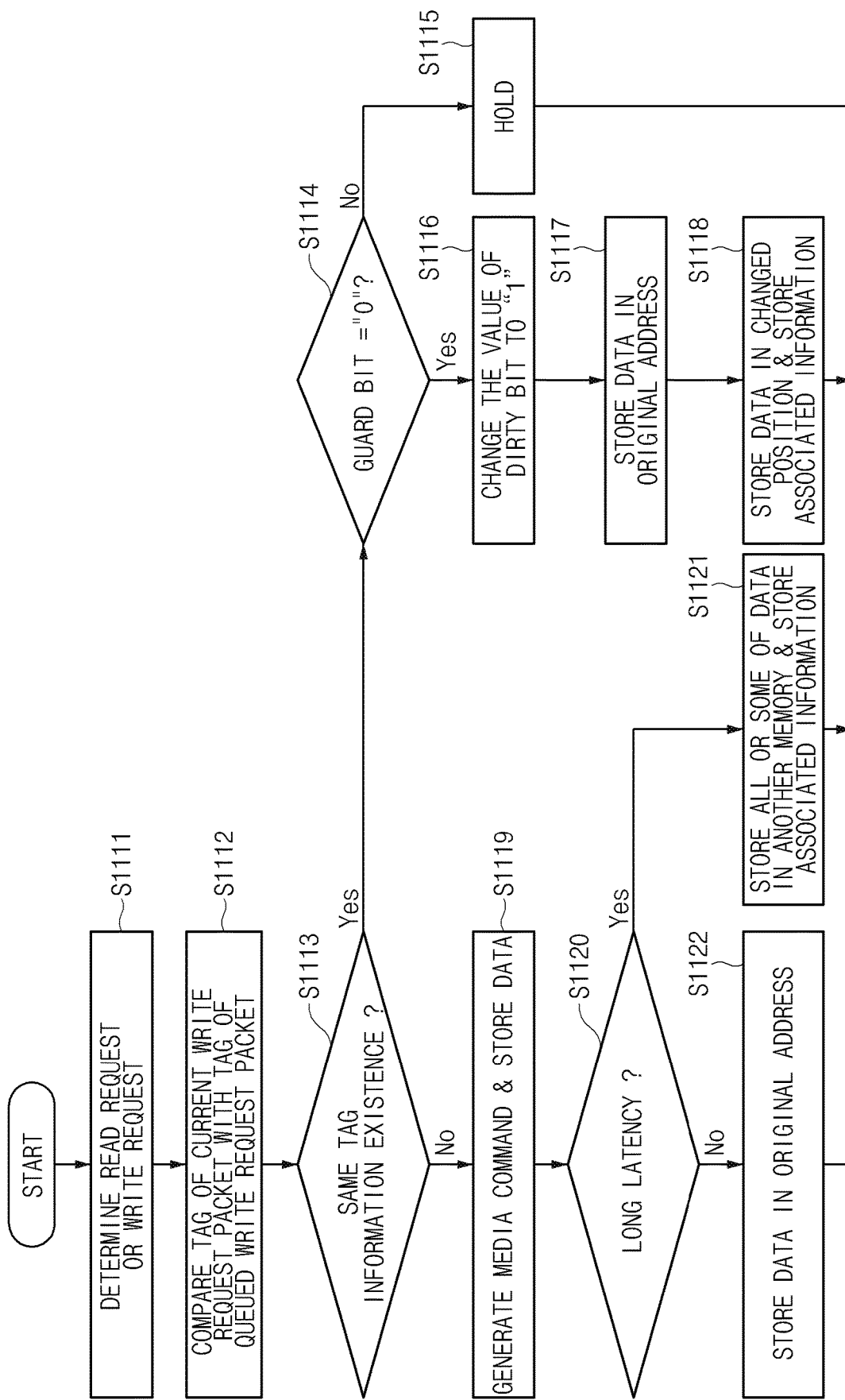
FIG. 11 is a flowchart illustrating an example of a data write process that may be used when some parts of an address are used as the entire tag.

FIGS. 10 and 11 are flowcharts illustrating the operations requested by the write request.

In an embodiment, packets having the same tag may be processed in different ways according to how to determine each tag of the packets. As can be seen from FIG. 8, the tag according to an embodiment may have a value independent of the address. Alternatively, some parts of the address may be used as some parts of the tag or the entire tag.

If a tag is used as an index for each packet, how to process packets having the same tag may vary according to how to create the tag.

First, in an example embodiment, the tag may have a value independent of the address, or some parts of the address may be used as some parts of the tag, as discussed below.

FIG. 10 is a flowchart illustrating an example of a data write process. In this example, the tag may have a value independent of the address, or some parts of the address may be used as some parts of the tag.

Referring to FIG. 10, in response to the request packet REQ_PKT provided from the memory controller 140, the packet transceiver 151 of the media controller 150 may confirm the OP code of the received packet, may determine whether the currently received packet is the write request packet or the read request packet, and may transmit a signal RD/WT_ID indicating the determined result to the tag comparator 152 (Step 1010).

If the currently received packet is the write request packet, the tag comparator 152 may compare a tag C_TAG of the currently received write request packet with each tag S_TAG of the queued write request packets previously received and queued in a buffer of the storage portion 154 (Step 1020), and may determine if there is any queued write request packet having the same tag as that of the currently received write request packet (Step 1030).

If there is any queued write request packet having the same tag as that of the current write request packet, the tag comparator 152 may transmit tag information C_TAG of the currently received write request packet to the data processor 153. In this case, the data processor 153 may determine the currently received write request packet to be a faulty packet, and may put a hold on processing the faulty packet (Step 1040).

The tag may be used as an identifier for identifying each packet. Thus, if there is any queued write request packet having the same tag as that of the currently received write request packet, it is impossible to distinguish between the packets, and thus data cannot be normally processed. Accordingly, in principle, in a situation where a previously received write request packet has not yet been processed, i.e., where the ACK signal to the corresponding packet has not yet been transmitted to the memory controller, it is not desirable to receive another packet (e.g., currently received write request packet) having the same tag as that of the corresponding packet (e.g., queued write request packet).

However, in an embodiment, if the tag of the current write request packet is identical to the tag of the queued write request packet, the data processor 153 may put a hold on processing the current write request packet. The held write request packet may be dropped after the corresponding queued write request packet is completely processed.

If there is no queued write request packet having the same tag as that of the current write request packet (Step 1030), the data processor 153 may process the write request packet according to the order of execution of programming. In other words, the data processor 153 may generate the media command MEDIA_CMD appropriate for the physical layer (PHY) and a protocol of a target memory to be accessed according to the order of execution of programming, and may perform the write operation by accessing the memory 200_1 according to the media command MEDIA_CMD (Step 1050).

In this case, if a latency of the accessed memory 200_1 increases (Step 1060), the data processor 420 may store all or some parts of data to be written in other memories (200_2 and 200_n), and may store associated information in the storage portion 154 (Step 1070).

For example, the data processor 420 may store, in the storage portion 154, specific information CHANGE, which includes tag information regarding the corresponding packet, an original storage position, and a changed storage position. When a write completion message is transferred to the memory controller 140 upon completion of the write operation requested by the corresponding packet, the stored information may also be transmitted to the memory controller 140.

If the latency of the accessed memory 200_1 is normal in step 422, the data processor 420 may access an original address according to the media command MEDIA_CMD and store data in the accessed original address (Step 1080).

FIG. 11 is a flowchart illustrating an example of a data write process that may be used when some parts of the tag are used as the entire tag.

Referring to FIG. 11, in response to the request packet REQ_PKT provided from the memory controller 140, the packet transceiver 151 of the media controller 150 may confirm the OP code of the received packet. The packet transceiver 151 of the media controller 150 may also determine whether the currently received packet is the write request packet or the read request packet, and may transmit the confirmed result to the tag comparator 152 (Step 1111).

If the current packet is the write request packet, the tag comparator 152 may compare a tag C_TAG of the current write request packet with each tag S_TAG of the queued write request packets previously received and queued in a buffer of the storage portion 154 (Step 1112), and may determine if there is any queued write request packet having the same tag as that of the current write request packet (Step 1113).

If there is any queued write request packet having the same tag as that of the current write request packet, the tag comparator 152 may transmit tag information C_TAG of the current write request packet to the data processor 153.

In this case, the data processor 153 may check a guard bit GUARD of the current write request packet (Step 1114).

If the guard bit GUARD is set to "1," the data processor 153 may put a hold on processing the current write request packet (Step 1115).

In contrast, if the guard bit GUARD is set to "0 (zero)," the data processor 153 may change the dirty bit DIRTY of the current write request packet to the value of "1" (Step 1116), and may change the original address stored in the corresponding packet either to an address of a different memory or to another address of the same memory (Step 1117).

In principle, as can be seen from FIG. 4, in a situation where the received write request packet has not yet been processed, it is not desirable to receive the current write request packet having the same tag as that of the queued write request packet.

However, in an embodiment, if the entire tag is created by using only some parts of the address as described above, some values of the address to be used for data storage may be identical even if all values of the address to be used for data storage are different. It is desirable for different packets to have different tags. In reality, however, some packets may unavoidably have the same tag because of a policy for creating such tags (e.g., policy for using some parts of the address as the entire tag). In this case, when the memory controller 140 generates a tag for the corresponding packet to transmit the request packet to the media controller 150, the memory controller 140 may determine whether or not the same tag as a previous one has been generated.

Where the policy for processing data of the corresponding packet is predefined, the memory controller 140 may allocate the value of "1" or "0" to the guard bit GUARD if the same tag is generated as described above. For example, the memory controller 140 may allocate the value of "1" to the guard bit GUARD as a default value. However, if the corresponding data is scheduled to be processed according to a separate policy, the guard bit GUARD may be set to zero "0".

The data processor 153 may change the address to another address, access the changed address, store data in the position corresponding to the changed address, and store associated information CHANGE including, for example, tag, original position, changed position, etc. in the storage portion 154 (Step 1118).

In this case, the data processor 153 may change a storage address to store data in another memory different from an originally desired target memory or at another position in the same memory as the originally desired target memory. For example, the data processor 153 may use at least one of various methods discussed below. First, a Least Significant Bit (LSB) of a rank address may be changed such that data is stored in another rank. Secondly, an address of a channel may be changed such that data is stored either in the same type of memory of another channel or in a different type of memory of another channel. Thirdly, a row address may be changed such that data is stored in another row contained in the same memory. Fourthly, a bank address may be changed such that data is stored in another bank contained in the same memory.

In accordance with an embodiment, if the current write request packet having the same tag as that of the queued write request packet is received, data of the current write request packet may be stored at another position (changed address). The stored data may be processed according to a separate policy.

If there is no queued write request packet having the same tag as the tag of the current write request packet (Step 1113), the data processor 153 may generate the media command MEDIA_CMD appropriate for the physical layer (PHY) and the protocol of a target memory to be accessed according to the order of execution of programming, and may perform the write operation by accessing the memory 200_1 according to the media command MEDIA_CMD (Step 1119).

In this case, if a latency time of the accessed memory 200_1 becomes longer (Step 1120), the data processor 420 may store all or some of data to be written in other memories 200_2 and 200_n, and may store associated information CHANGE in the storage portion 154 (Step 1121).

For example, the data processor 420 may store not only tag information regarding the corresponding packet, but also information regarding an original storage position and a changed storage position of the corresponding packet in the storage portion 154. When a message indicating that the write completion has been transmitted to the memory controller 140 after completion of the write operation for the corresponding packet, the above-mentioned information stored in the storage portion 154 may also be transmitted to the memory controller 140 as necessary.

If a latency time of the accessed memory 200_1 is normal (Step 530), the data processor 153 may access an original address of the memory 200_1 in response to the media command MEDIA_CMD, and may store data in the original address (Step 1122).

Although FIGS. 10 and 11 have disclosed only the write request packet as an example, if the memory controller 200 receives the read request packet for a memory, the memory controller 200 may access the address contained in the read request packet according to the order of execution, and may read data stored at the position indicating the accessed address. That is, the above-mentioned address change may not be applied to the read request, and as such a detailed description thereof will herein be omitted.

Figure 12:
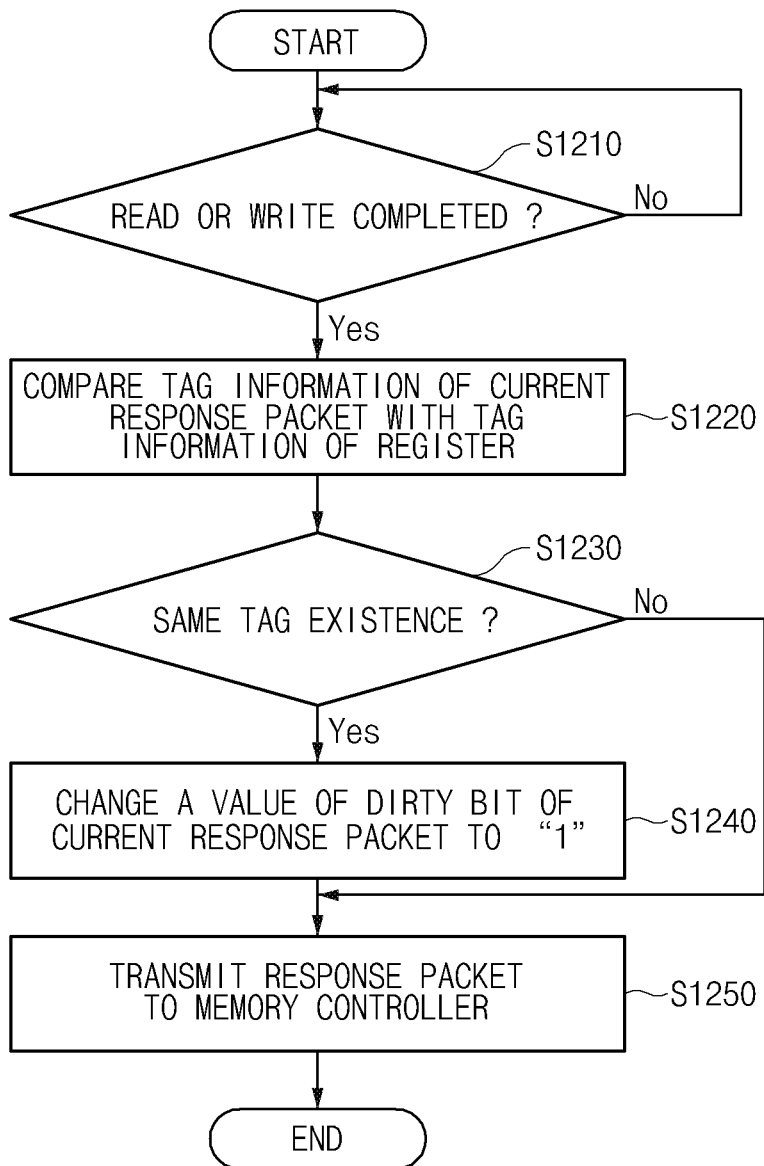
FIG. 12 is a flowchart illustrating example operations that may be carried out when a response to a requested packet is executed.

FIG. 12 is a flowchart illustrating example operations that may be carried out when a response to a requested packet is executed.

Referring to FIG. 12, if the data processor 153 completes the data read operation or the data write operation in response to the read request or the write request provided from the memory controller 140 (Step 1210), the tag comparator 152 may compare a tag of the current response packet with tag information stored in the tag register of the storage portion 154 (Step 1220).

For example, during the read response mode, if the tag comparator 152 receives a message indicating that a read operation has been completed or read data has been received from the data processor 153, the tag comparator 152 may compare a tag of the current read response packet with tag information stored in the tag register of the storage portion 154. In the write response mode, if the tag comparator 152 receives a message indicating that a write operation has been completed from the data processor 153, the tag comparator 152 may compare a tag of the current write response packet with tag information stored in the tag register of the storage portion 154.

Upon completion of such comparisons, the tag comparator 152 may transmit a signal TAT_COMP indicating the result of comparison to the packet transceiver 151 (Step 1230).

If there is the same tag as a tag of the current response packet in the tag register (Step 1230), the packet transceiver 151 may change a dirty bit DIRTY of the corresponding current response packet (current read response packet or current write response packet) to the value of "1" (Step 1230). The packet transceiver 151 may change the dirty bit DIRTY of the corresponding current response packet (current read response packet or current write response packet) to the value of "1" (Step 1240).

Upon completion of such changes, the packet transceiver 151 may insert read data (in the case of the read response) or an ACK signal (in the case of the write response) in a data field of the response packet RES_PKT, and may transmit the resultant data field to the memory controller 140 (Step 1250).

If there is no tag that is the same as a tag of the current response packet in the tag register (Step 1230), the packet transceiver 151 may insert either read data (in the case of the read response) or an ACK signal (in the case of the write response) in a data field of the response packet, without changing the value of the dirty bit DIRTY to another value, and may transmit the resultant data field to the memory controller 140 (Step 1250).

In other words, prior to transmitting the response packet to the memory controller 140, the media controller 150 may first determine whether read or write data corresponding to the corresponding response is address-changed data shown in FIG. 5. If the read or write data is determined to be the address-changed data, the media controller 150 may change a dirty bit of the corresponding response packet to the value of "1," and may transmit the resultant response packet having the dirty bit of "1" to the memory controller 140, and then may notify, to the memory controller 140, the occurrence of address change on the basis of the received response packet.

As discussed above, various embodiments of the present disclosure can allow a single memory controller to control read and write (R/W) operations with respect to different kinds of memories by applying only one protocol to the different kinds of memories, and the number of iterations of creation and transmission/reception (Tx/Rx) of control signals may decrease, and thus system load may decrease.

In addition, various embodiments of the present disclosure can minimize a latency variation otherwise encountered in processing data stored in different types of memories having different latency variations.

Those skilled in the art will appreciate that embodiments of the present disclosure may be carried out in other ways than those set forth herein without departing from the spirit and essential characteristics of these embodiments. The above embodiments are therefore to be construed in all aspects as illustrative and not restrictive.

The above embodiments of the present disclosure are illustrative and not limitative. Various alternatives and equivalents are possible. The above embodiments are not limited by the type of deposition, etching polishing, and patterning steps described herein. Nor is the embodiment limited to any specific type of semiconductor device. For example, the present disclosure may be implemented in a dynamic random access memory (DRAM) device or nonvolatile memory device. Other additions, subtractions, or modifications are intended to fall within the scope of the appended claims.

Hereinafter, a calibration circuit and a calibration apparatus including the same will be described below with reference to the accompanying figures through various embodiments. Various embodiments are directed to a calibration circuit which may start an impedance matching operation in response to an external command signal and a signal generated as impedance matching is completed in another internal circuit. In addition, various embodiments are directed to a calibration circuit which may generate a completion signal as an impedance matching operation is completed such that another calibration circuit sharing a resistor for impedance matching may start an impedance matching operation. Further, various embodiments are directed to a calibration apparatus which include a plurality of the calibration circuits to receive completion signals from immediately previous calibration circuits, as start signals, and sequentially perform impedance matching operations, thereby reducing a total impedance matching time. According to the embodiments, the calibration circuit and the calibration apparatus including the same according to the embodiments may selectively perform an impedance calibration (ZQ) in one die among a plurality of dies in response to one signal of a command signal applied from an exterior and a signal applied from another calibration circuit to indicate completion of impedance matching. Therefore, in comparison with the case in which impedance matching is performed by applying respective commands when a plurality of calibration circuits operate, a total calibration time may be decreased.

Figure 13:
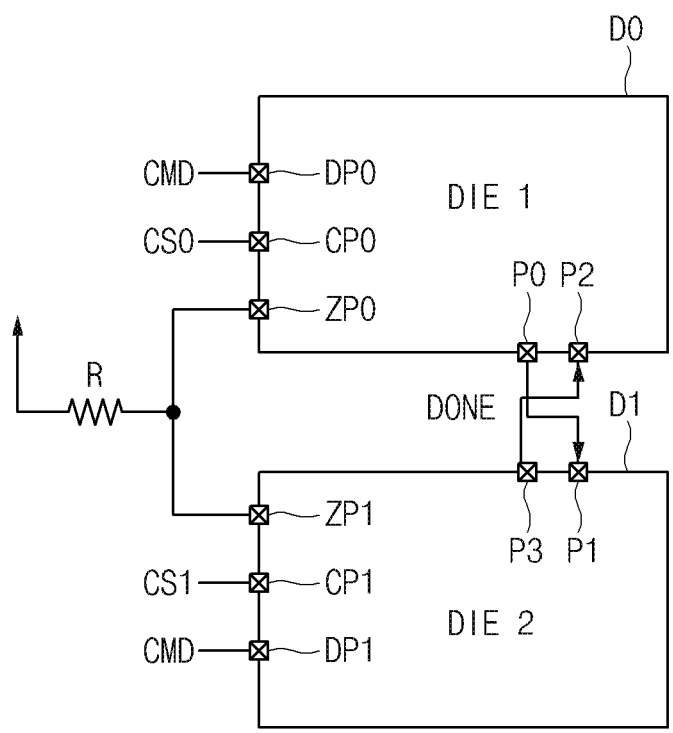
FIG. 13 is a diagram illustrating a representation of an example of a configuration including calibration circuits which share a resistor for impedance matching, in accordance with an embodiment.

Referring to FIG. 13, a diagram illustrating a representation of an example of a configuration including calibration circuits which share a resistor for impedance matching, in accordance with an embodiment is shown.

FIG. 13 shows the relationship of a first die D0 and a second die D1 which share a resistor R for impedance matching. The first die D0 and the second die D1 may include a calibration circuit disposed thereon. According to an embodiment, the first die D0 and the second die D1 may include a volatile memory or a nonvolatile memory. According to an embodiment, the first die D0 and the second die D1 may be formed with a volatile memory. According to another embodiment, the first die D0 and the second die D1 may be formed with a nonvolatile memory. According to the other embodiment, the first die D0 may be formed with a volatile memory and the second die D1 may be formed with a nonvolatile memory.

Further, the first die D0 and the second die D1 may include a driving circuit which performs operations for input and output of data or signals from and to an exterior based on the matching code generated in the calibration circuit. In this specification, the term calibration is used as a concept that includes impedance matching.

The first die D0 and the second die D1 simultaneously receive a command signal CMD through a first command pad DP0 and a second command pad DP1. Various control information may be included in the command signal CMD. In this specification, it will be described as an example that a command for performing an impedance matching operation is included in the command signal CMD.

If the first die D0 and the second die D1 simultaneously perform impedance matching operations, since the plurality of dies D0 and D1 share the one resistor R for impedance matching, resistance values are likely to be distorted as a result. Therefore, at one time, one die is electrically coupled with the resistor R for impedance matching. Further, the one die performs an impedance matching operation.

A die selected by each of chip select signals CS0 and CS1 may perform an impedance matching operation. For example, the first die D0 may perform the impedance matching operation according to the value received through a first matching pad ZP0 from the resistor R for impedance matching according to the first chip select signal CS0 received through a pad CP0. Further, at a time different from a time when the first die D0 performs impedance matching, the second die D1 may perform the impedance matching operation according to the value received through a second matching pad ZP1 from the resistor R for impedance matching according to the second chip select signal CS1 received through a pad CP1.

However, because a certain time is required between times at which the chip select signals CS0 and CS1 are respectively provided, an unnecessary time may be consumed between times at which impedance matching is completely performed in the respective dies D0 and D1 as a result.

Hence, in the calibration circuit in accordance with an embodiment, the second die D1 may start impedance matching in response to a completion signal DONE generated as impedance matching is completed in the first die D0.

The respective dies D0 and D1 may include pads which provide the completion signal DONE to other dies and receive the completion signal DONE provided from other dies. For instance, the completion signal DONE may be outputted through a first pad P0 of the first die D0 and be provided to the second die D1 through a second pad P1. In addition, the second die D1 may provide the completion signal DONE to another die through a fourth pad P3 when impedance matching is completed. The first die D0 may receive the completion signal DONE from another side through a third pad P2.

According to the embodiment, the first die D0 and the second die D1 are connected by a chain structure. The completion signal DONE outputted from the fourth pad P3 of the second die D1 may be received by the third pad P2 of the first die D0.

Figure 14:
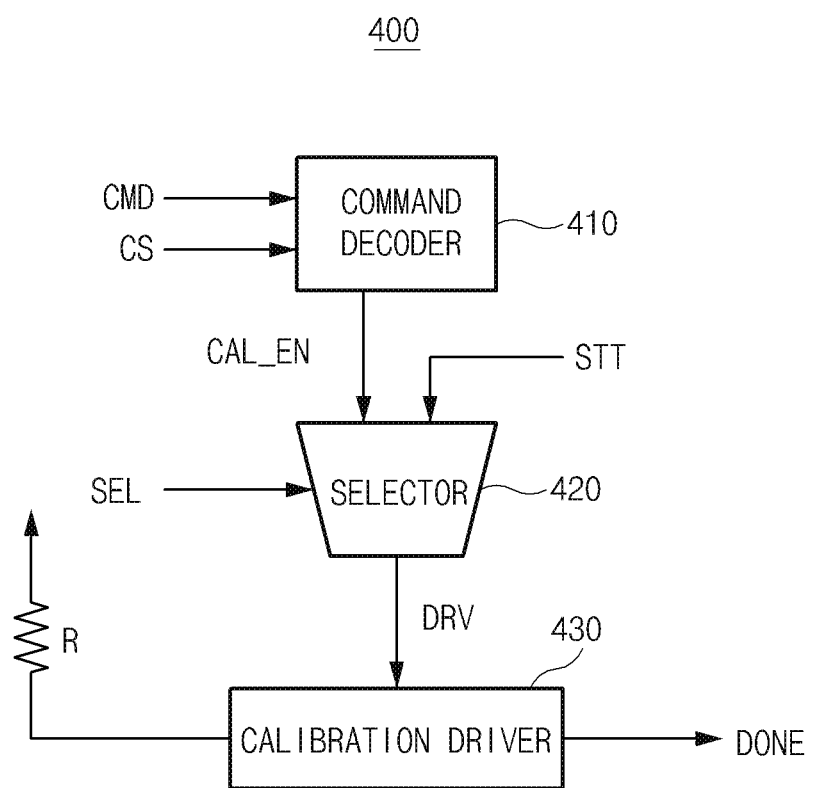
FIG. 14 is a block diagram illustrating a representation of an example of a calibration circuit in accordance with an embodiment.

Referring to FIG. 14, a block diagram illustrating a representation of an example of a calibration circuit in accordance with an embodiment is shown.

In FIG. 14, a calibration circuit 400 may include a command decoder 410, a selector 420, and a calibration driver 430.

The command decoder 110 decodes a command signal CMD received into a calibration enable signal CAL_EN. According to an embodiment, the command decoder 410 may decode the command signal CMD in response to a chip select signal CS. The command decoder 410 may selectively provide the calibration enable signal CAL_EN to the selector 420 based on the chip select signal CS.

In particular, the command signal CMD may be decoded where a corresponding chip is selected according to the chip select signal CS, or, where a plurality of calibration circuits are successively electrically coupled. Further, a calibration circuit which initially performs impedance matching may decode the command signal CMD. This is because it is not necessary to decode the command signal CMD where a calibration circuit 400 performs impedance matching in response to a completion signal DONE provided from another calibration circuit 400.

The selector 420 selects one of the calibration enable signal CAL_EN and a start signal STT in response to a select signal SEL, and provides a driving signal DRV. The start signal STT may correspond to the completion signal DONE provided from another calibration circuit 100 which shares a resistor R for impedance matching with the calibration circuit 400.

The select signal SEL provided to the selector 420 may correspond to a signal provided from an exterior of the calibration circuit 400, or may be a signal generated internally of the calibration circuit 400. A manner in which the select signal SEL is provided will be described in detail with reference to FIGS. 15 and 16 below.

The select signal SEL may be differently generated according to in which order a corresponding calibration circuit 400 is placed among sequential impedance matching operations. For example, when a calibration circuit 400 initially performs impedance matching in response to the command signal CMD, the command signal CMD should be selected and provided as the driving signal DRV. In this case, the start signal STT may not be provided from the exterior.

When a calibration circuit 400 receives the completion signal DONE from another calibration circuit 400 as the start signal STT, that is, a calibration circuit 400 which is not placed initially among the sequential impedance matching operations, the start signal STT should be selected and provided as the driving signal DRV.

According to the embodiment, if the calibration circuit 400 is the second die D1, an impedance calibration operation of the second die D1 may be automatically performed. That is, if the start signal STT is activated, the driving signal DRV is activated, and accordingly, an impedance calibration operation of the calibration circuit 400 may be performed by the calibration driver 430, regardless of a selection signal SEL.

According to an embodiment, the select signal SEL may be provided to the calibration driver 430 and control the generation of the completion signal DONE. For instance, when a calibration circuit 100 is placed finally among the sequential impedance matching operations, it is not necessary to provide the completion signal DONE to another calibration circuit 100. Accordingly, the select signal SEL includes information on in which order a corresponding calibration circuit 400 is placed among the sequential impedance matching operations, such that the calibration driver 430 may not generate the completion signal DONE where the calibration circuit 400 corresponds to a calibration circuit which performs a final impedance matching operation. According to the embodiment, the completion signal DONE outputted from the second die D1 may be feedback inputted in the first die D0. In this case, a calibration circuit 400 generates the completion signal DONE and outputs the generated completion signal DONE to the first die D0.

The calibration driver 430 performs an impedance matching operation in response to the driving signal DRV. Further, the calibration driver 430 generates the completion signal DONE as the performance of impedance matching is completed. The calibration driver 430 performs the impedance matching operation by comparing the value received through the resistor R for impedance matching and a reference value and generating a matching code.

Since operations in the calibration driver 430 are similar to the conventional impedance matching operation, detailed descriptions thereof will be omitted.

The calibration driver 430 may generate the completion signal DONE by various methods. Methods for the calibration driver 430 to generate the completion signal DONE will be described later with reference to FIGS. 17 and 18 below.

As described above, the calibration circuit 400 in accordance with an embodiment receives the calibration enable signal CAL_EN generated based on the external command signal CMD and the start signal STT as the completion signal DONE is provided as impedance matching is completed in another calibration circuit, selects one of the two signals, and provides the driving signal DRV. Accordingly, impedance matching may be started according to the external command signal CMD or in response to a signal generated as impedance matching in an immediately previous calibration circuit where the sequential impedance matching operations are completed.

Therefore, it is possible to reduce times to be consumed between impedance matching operations of a plurality of dies in each of which the calibration circuit 400 is included. As a result, impedance matching may be performed in an immediately next calibration circuit when the operation of an immediately previous calibration circuit is completed.

Figure 15:
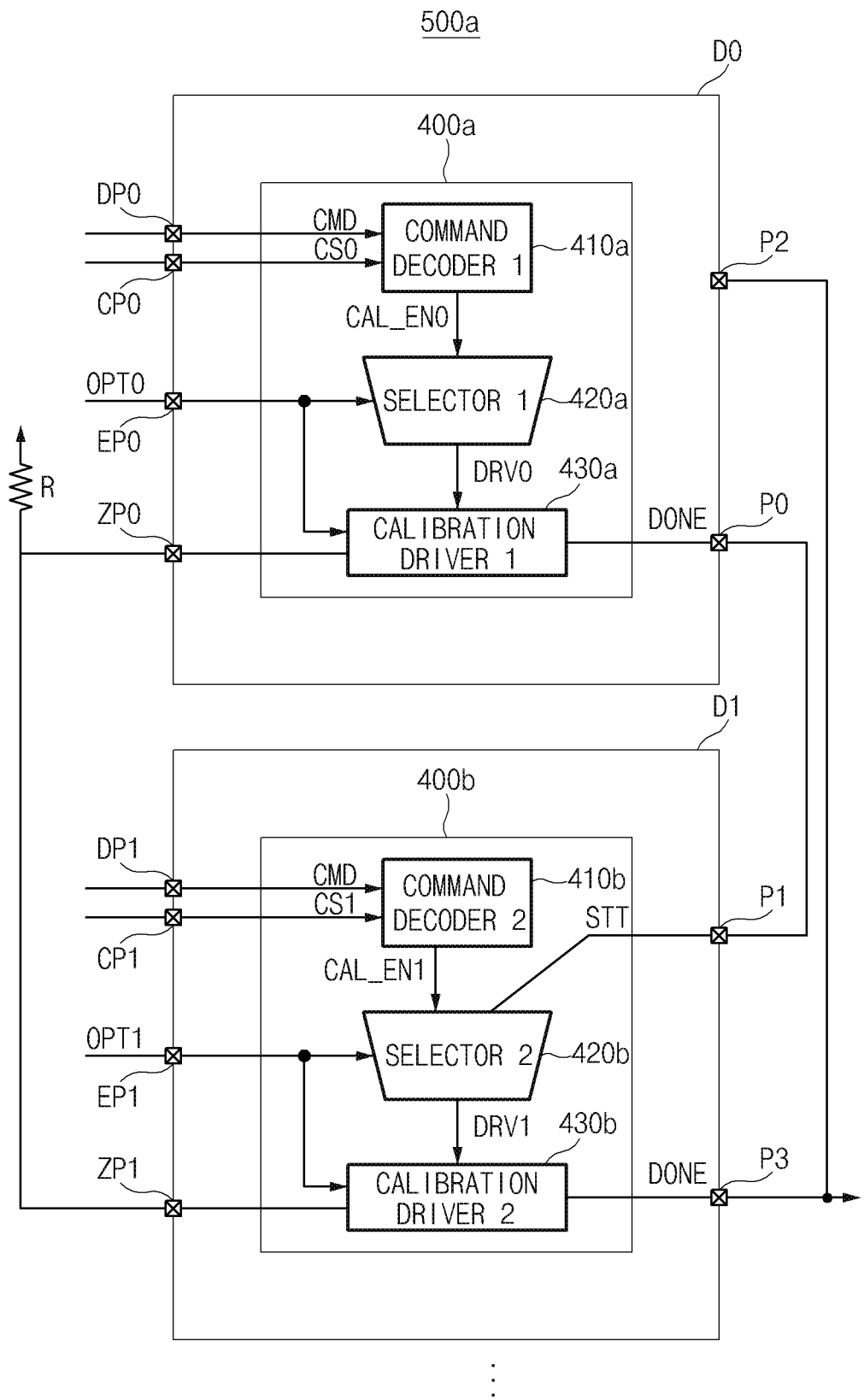
FIGS. 15 and 16 are diagrams illustrating representations of examples of calibration apparatuses including calibration circuits in accordance with embodiments.
Figure 16:
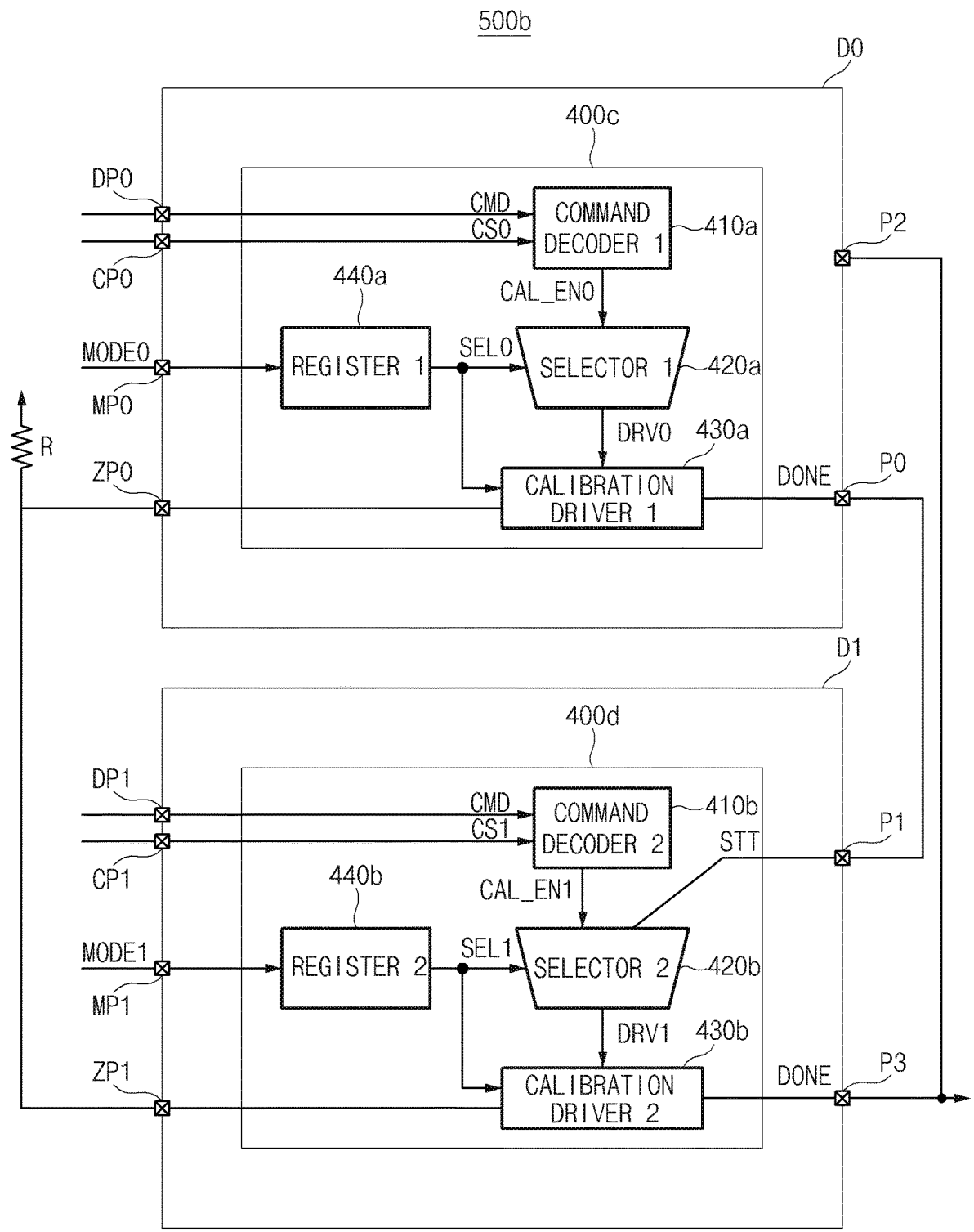

Referring to FIGS. 15 and 16, diagrams illustrating representations of examples of calibration apparatuses including calibration circuits in accordance with embodiments are illustrated. While it is shown in FIGS. 15 and 16 that two dies D0 and D1 are included in a calibration apparatus, it is to be noted that the embodiments are not limited to such an example and one or more dies may be additionally disposed between the first die D0 and the second die D1. According to the embodiment, as for a plurality of dies in calibration apparatuses, 4, 8, 16, 32, and more dies may be disposed, including the first die D0 and the second die D1. The dies formed with a plurality of calibration circuits may be mounted to one printed circuit board (PCB). The plurality of dies may sequentially perform impedance matching operations.

In FIG. 15, a calibration apparatus 500a may include a first calibration circuit 400a and a second calibration circuit 400b. The first calibration circuit 400a is formed on a first die D0. In addition, the second calibration circuit 400b is formed on a second die D1. The calibration apparatus is formed on one substrate.

The first calibration circuit 400a decodes a command signal CMD received through a first command pad DP0 into a first calibration enable signal CAL_EN0. The first calibration circuit 400a performs an impedance matching operation by reading in the value of a resistor R for impedance matching in response to the decoded first calibration enable signal CAL_EN0. In addition, the first calibration circuit 400a generates a completion signal DONE as the impedance matching operation is completed.

The completion signal DONE is provided to a second pad P1 of the second die D1 through a first pad P0 of the first die D0.

The second calibration circuit 400b formed in the second die D1 shares the resistor R for impedance matching, with the first calibration circuit 400a, and receives the completion signal DONE provided to the second pad P1, as a start signal STT. The second calibration circuit 400b performs an impedance matching operation according to the start signal STT.

Since the second calibration circuit 400b performs the impedance matching operation immediately in response to the completion of the impedance matching operation of the first calibration circuit 400a, time consumption does not occur between the impedance matching operations of the two calibration circuits 400a and 400b.

Both the first calibration circuit 400a and the second calibration circuit 400b have substantially the same configuration as the calibration circuit 400 described above with reference to FIG. 2.

The first calibration circuit 100a may include a first command decoder 410a which decodes the command signal CMD provided through the first command pad DP0. The first calibration circuit 400a may also include a first selector 420a which selects one of the first calibration enable signal CAL_EN0 decoded in the first command decoder 410a and a start signal (not shown) and provides a first driving signal DRV0. Further, the first calibration circuit 400a may include a first calibration driver 430a which starts the impedance matching operation in response to the first driving signal DRV0 and generates the completion signal DONE as impedance matching is completed.

While the first calibration circuit 400a may receive the start signal through a third pad P2 when viewed in its structure, because the first calibration circuit 400a is placed initially among sequential impedance matching operations, an immediately previous calibration circuit for providing the start signal to the first calibration circuit 400a does not exist. Accordingly, it is illustrated that the first calibration circuit 400a does not receive the start signal.

However, the embodiments of the present invention are not limited to such. The first calibration circuit 400a receives the start signal STT, which is applied from the second calibration circuit 400b, as the completion signal DONE through the third pad P2. Moreover, according to an embodiment, the command decoder 410a may determine whether to decode the command signal CMD into the first calibration enable signal CAL_EN0 according to a first chip select signal CS0 provided through a pad CP0.

FIG. 15 shows that select signals (see the select signal SEL of FIG. 14) provided to the first calibration circuit 400a and the second calibration circuit 400b correspond to the voltage values provided through select pads EP0 and EP1. Moreover, a voltage corresponding to a select signal SEL for indicating an order of the second calibration circuit 400b among a plurality of circuits which share the resistor R for impedance matching that is received through a select pad EP1.

For example, if a voltage value corresponding to a power supply voltage VDD is provided to the first selector 420a through the first select pad EP0 as the select signal, the first selector 420a determines that the first calibration circuit 400a should start the impedance matching operation in response to not the start signal STT but the first calibration enable signal CAL_EN0.

The power supply voltage VDD may be provided as a first option signal OPT0 from an exterior. It is to be noted that the application of the power supply voltage VDD as described above is an illustration purpose. In addition, it is sufficient that the voltage values provided through the select pads EP0 and EP1 are values that may perform control tasks such that voltages capable of allowing the differences between the first calibration circuit 400a and the second calibration circuit 400b to be recognized are applied. Further, the respective calibration circuits 400a and 400b may be aware of their placements and select appropriate signals.

The fact that the first calibration circuit 400a starts the impedance matching operation in response to the first calibration enable signal CAL_EN0 may mean that the first calibration circuit 100a is a calibration circuit which initially performs the impedance matching operation, or, a calibration circuit which is placed initially.

The first calibration driver 430a performs the impedance matching operation according to the first driving signal DRV0. The first calibration driver 430a may perform the impedance matching operation by reading in the value of the resistor R for impedance matching through a first matching pad ZP0.

According to an embodiment, the generation of the completion signal DONE may be enabled or disabled according to the value provided through the first select pad EP0. For instance, since the first calibration circuit 400a is a calibration circuit which performs initially the impedance matching in sequential impedance matching operations, the first calibration circuit 400a should provide the completion signal DONE to another calibration circuit electrically coupled thereto, or, the second calibration circuit 400b. Accordingly, the first calibration driver 430a enables the generation of the completion signal DONE.

The second calibration circuit 400b may include a second command decoder 410b, a second selector 420b, and a second calibration driver 430b. The second command decoder 410b may receive a second chip select signal CS1 through a second chip select pad CP1. Further, the second command decoder 410b may selectively decode the command signal CMD provided through a second command pad DP1 into a second calibration enable signal CAL_EN1.

The second selector 420b receives the second calibration enable signal CAL_EN1 and the completion signal DONE provided as the start signal STT through the second pad P1. The second selector 420b selects the start signal STT based on a second option signal OPT1 received through the second select pad EP1. In addition, the second selector 420b provides a second driving signal DRV1 to the second calibration driver 430b. Accordingly, in the second calibration driver 430b, the impedance calibration operation is performed by a second driving signal DRV1 which is generated based on the completion signal DONE of the first calibration circuit 400a.

For example, if the first option signal OPT0 provided through the first select pad EP0 is a value corresponding to the power supply voltage VDD, the second option signal OPT1 provided through the second select pad EP1 may be a value corresponding to a ground voltage VSS. However, as described above, the first option signal OPT0 and the second option signal OPT1 are not limited to the voltage values described above. Further, it is to be noted that values capable of allowing the first calibration circuit 100a and the second calibration circuit 400b to be distinguished from each other are sufficient.

The option signals OPT0 and OPT1 may correspond to select signals (see the reference symbol SEL of FIG. 14) indicating that the corresponding calibration circuits 400a and 400b are placed in which orders when a plurality of calibration circuits are sequentially electrically coupled and perform impedance matching operations.

The second calibration driver 430b performs the impedance matching operation by reading the value of the resistor R for impedance matching according to the driving signal DRV through a second matching pad ZP1, comparing the value with a reference value, and generating a matching code. The second calibration driver 430b may generate or may not generate the completion signal DONE in response to the second option signal OPT1 provided through the second select pad EP1.

For example, if it is determined through the second option signal OPT1 that there is no calibration circuit to perform impedance matching, after the second calibration circuit 400b, the second calibration driver 430b may not generate the completion signal DONE. FIG. 15 illustrates that the second calibration driver 430b provides the completion signal DONE through a fourth pad P3. According to the embodiment, the completion signal DONE, generated in the second calibration circuit 400b, is inputted in the second calibration driver 430b by feedback. Then, the second calibration driver 430b receives the completion signal DONE through the third pad P2.

Referring to FIG. 16, a diagram illustrating a representation of an example of a calibration apparatus including calibration circuits in accordance with an embodiment is shown.

In FIG. 16, a calibration apparatus 500b may include a third calibration circuit 400c and a fourth calibration circuit 400d.

When compared to FIG. 15, the calibration circuits 400c and 400d of FIG. 16 may include registers 440a and 440b.

The calibration circuits 400a and 400b of FIG. 15 determine orders in which the corresponding calibration circuits 400a and 400b are placed by receiving the option signals OPT0 and OPT1 through the select pads EP0 and EP1. The calibration circuits 400c and 400d of FIG. 16 respectively include the registers 440a and 440b which receive mode signals MODE0 and MODE1 through mode pads MP0 and MP1 and temporarily store the mode signals MODE0 and MODE1. FIG. 16 also illustrates select signals SEL0 and SEL1.

In the plurality of calibration circuits 400c and 400d which share a resistor R for impedance matching, the mode signals MODE0 and MODE1 may correspond to signals indicating orders in which the corresponding calibration circuits 400a and 400b perform impedance matching among sequential impedance matching operations accordingly.

The mode signals MODE0 and MODE1 may be provided from a component element such as an external controller. Further, the mode signals MODE0 and MODE1 may be temporarily stored in the registers 440a and 440b. According to an embodiment, each of the mode signals MODE0 and MODE1 may correspond to a general mode register signal. In addition, information indicating a corresponding order may be included in one bit among a plurality of bits which configure the mode register signal. The registers 440a and 440b may be configured to receive the mode signals MODE0 and MODE1 that may indicate an order of a corresponding calibration circuit among calibration circuits which share the resistor R for impedance matching, and provide the select signal SEL0 or SEL1.

Figure 17:
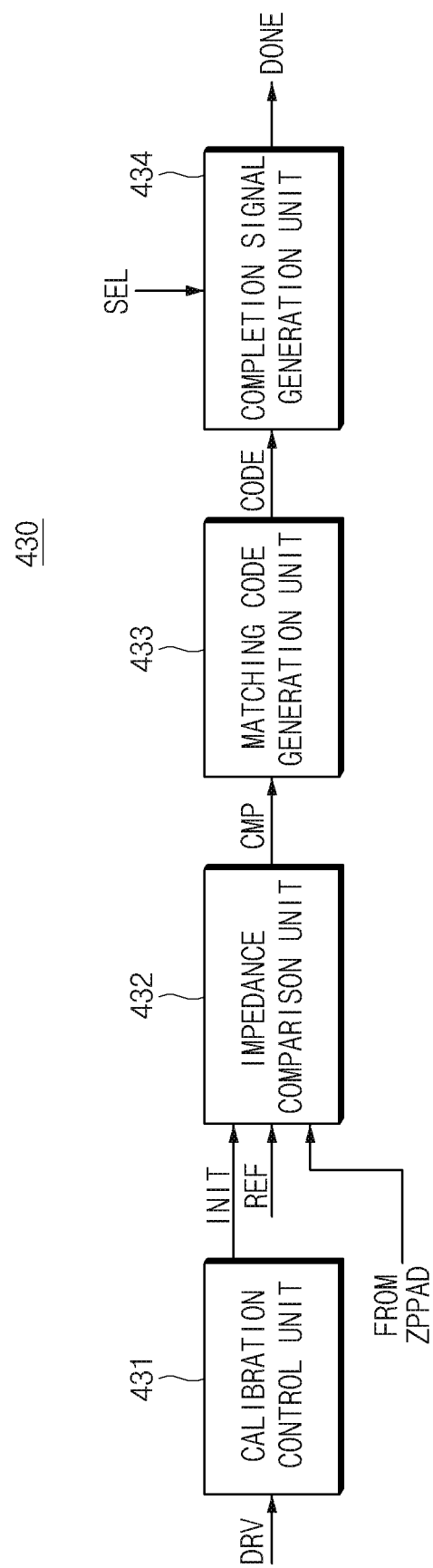
FIG. 17 is a block diagram illustrating a representation of an example of the calibration driver included in the calibration circuit in accordance with an embodiment.

Referring to FIG. 17, a block diagram illustrating a representation of an example of the calibration driver included in the calibration circuit in accordance with an embodiment is shown.

In FIG. 17, the calibration driver 430 may include a calibration control unit 431, an impedance comparison unit 432, a matching code generation unit 433, and a completion signal generation unit 434.

The calibration control unit 431 generates an operation start signal INIT in response to the driving signal DRV which is provided from the selector 420. The impedance comparison unit 432 receives the value of the resistor R for impedance matching, provided from the matching pad ZP (FROM ZPPAD), in response to the operation start signal INIT, and compares the value with a reference value REF. The impedance comparison unit 432 provides a comparison signal CMP corresponding to a comparison value to the matching code generation unit 433.

The matching code generation unit 433 generates a matching code CODE based on the comparison signal CMP. By controlling the value of a resistor electrically coupled to an output driver according to the matching code CODE, impedances may be matched accordingly.

The completion signal generation unit 434 generates the completion signal DONE as impedance matching is completed. The completion signal generation unit 434 may be configured to generate the completion signal DONE when a preset time has passed after the impedance matching operation has started in response to the driving signal DRV. According to an embodiment, the completion signal DONE may be generated in the case where the matching code CODE generated according to the impedance matching operation is not changed for a predetermined time. Impedance matching may be repeatedly performed with a constant cycle after being started in response to the driving signal DRV. This is because the fact that the matching code CODE retains a constant value means that the stably completed matching code CODE is obtained.

According to an embodiment, the completion signal generation unit 434 may operate by being activated in response to the select signal SEL. More specifically, if the select signal SEL is enabled, the completion signal DONE may not be generated.

Figure 18:
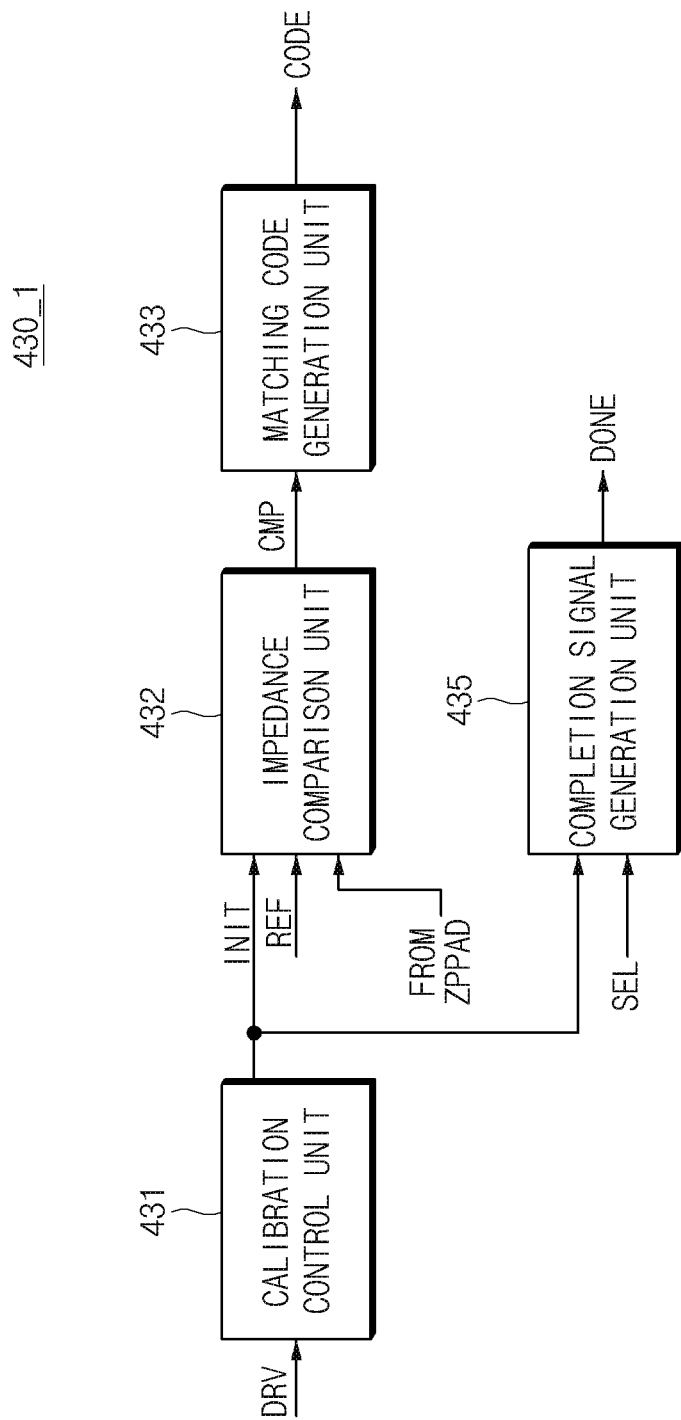
FIG. 18 is a block diagram illustrating a representation of an example of the calibration driver included in the calibration circuit in accordance with an embodiment.

Referring to FIG. 18, a block diagram illustrating a representation of an example of the calibration driver included in the calibration circuit in accordance with an embodiment is shown.

In FIG. 6, a calibration driver 430_1 may include a calibration control unit 431, an impedance comparison unit 432, a matching code generation unit 433, and a completion signal generation unit 435.

When comparing the calibration driver 430_1 of FIG. 18 with the calibration driver 430 of FIG. 17, the completion signal generation unit 435 counts a time from when an impedance matching operation is started to be performed by receiving an operation start signal INIT from the calibration control unit 431.

The completion signal generation unit 435 may generate the completion signal DONE when a preset time has passed after the impedance matching operation is started to be performed. For instance, the completion signal generation unit 435 may include a counter which operates in synchronization with an oscillation signal.

For example, in a calibration apparatus in which a plurality of calibration circuits are included, if impedance matching should be completed within a preselected time for all calibration circuits after the command signal CMD is applied, the preset time for the completion signal generation unit 435 to generate the completion signal DONE may be determined based on the number of the plurality of calibration circuits for which impedance matching should be sequentially performed.

As is apparent from the above descriptions, the calibration circuit 100 in accordance with an embodiment performs impedance matching, or, a calibrating operation in response to one of the external command signal CMD and the completion signal DONE generated according to impedance matching completion of another calibration circuit. Accordingly, where impedance matching is sequentially performed in a plurality of calibration circuits 100 which share the resistor R for impedance matching, since times required between operations of the respective calibration circuits 100 may be shortened, a total time required to perform calibration may be reduced as a result.

Further, in the calibration apparatus including the calibration circuit 400 in accordance with an embodiment, the calibration circuit 400 may perform a calibrating operation, or, impedance matching, in response to a signal indicating in which order among a plurality of entire calibration circuits impedance matching is to be performed.

Figure 19:
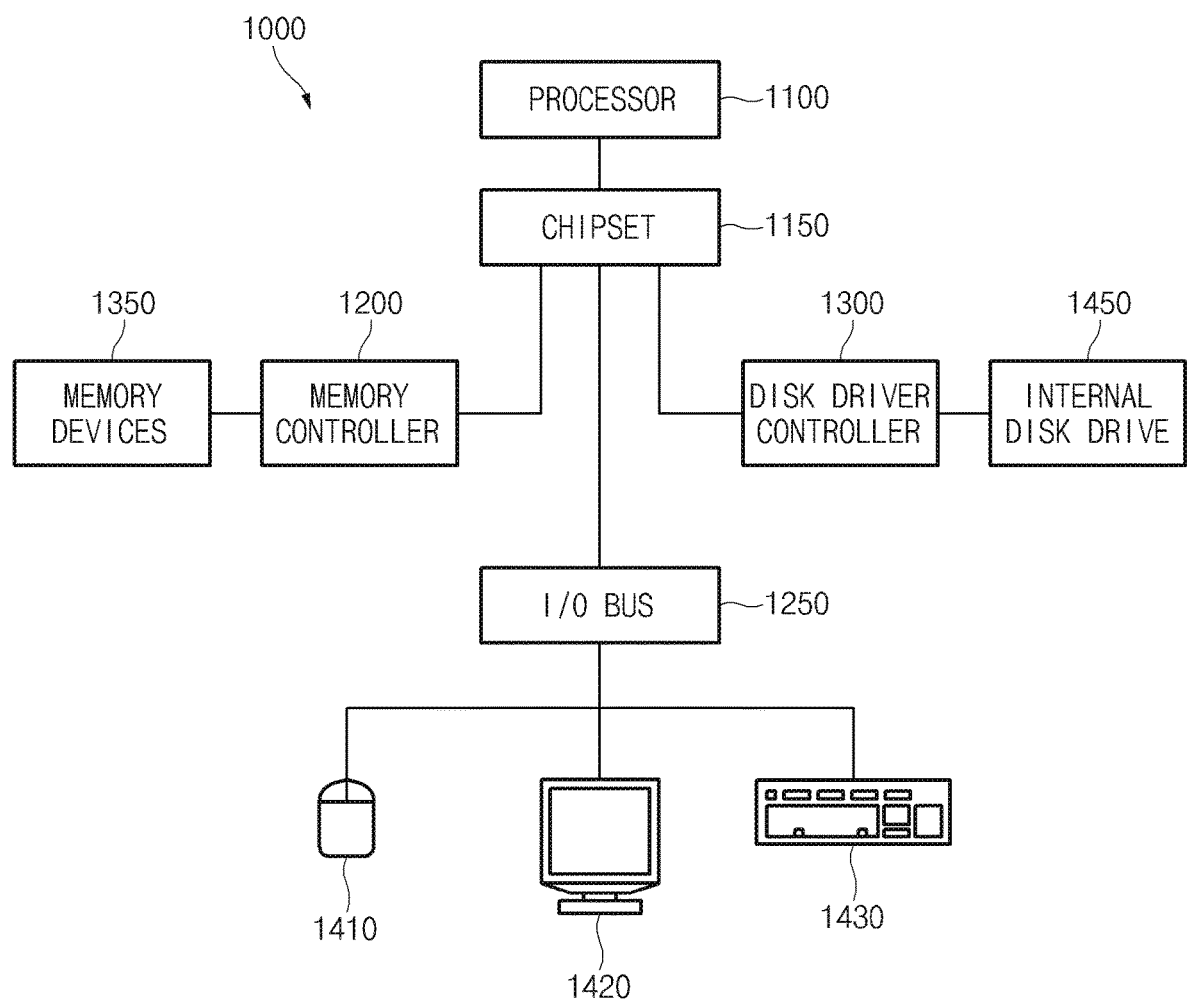
FIG. 19 illustrates a block diagram of a system employing a memory controller circuit in accordance with an embodiment of the invention.

Referring to FIG. 19, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory devices 1350 may include the calibration apparatus described above.

The chipset 1150 may also be electrically coupled to the I/O bus 1250. The I/O bus 1250 may serve as a communication pathway for signals from the chipset to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

While various embodiments have been described above, it will be understood to those skilled in the art that the embodiments described are by way of example only. Accordingly, the calibration circuit and the calibration apparatus including the same described should not be limited based on the described embodiments above.

Figure 20:
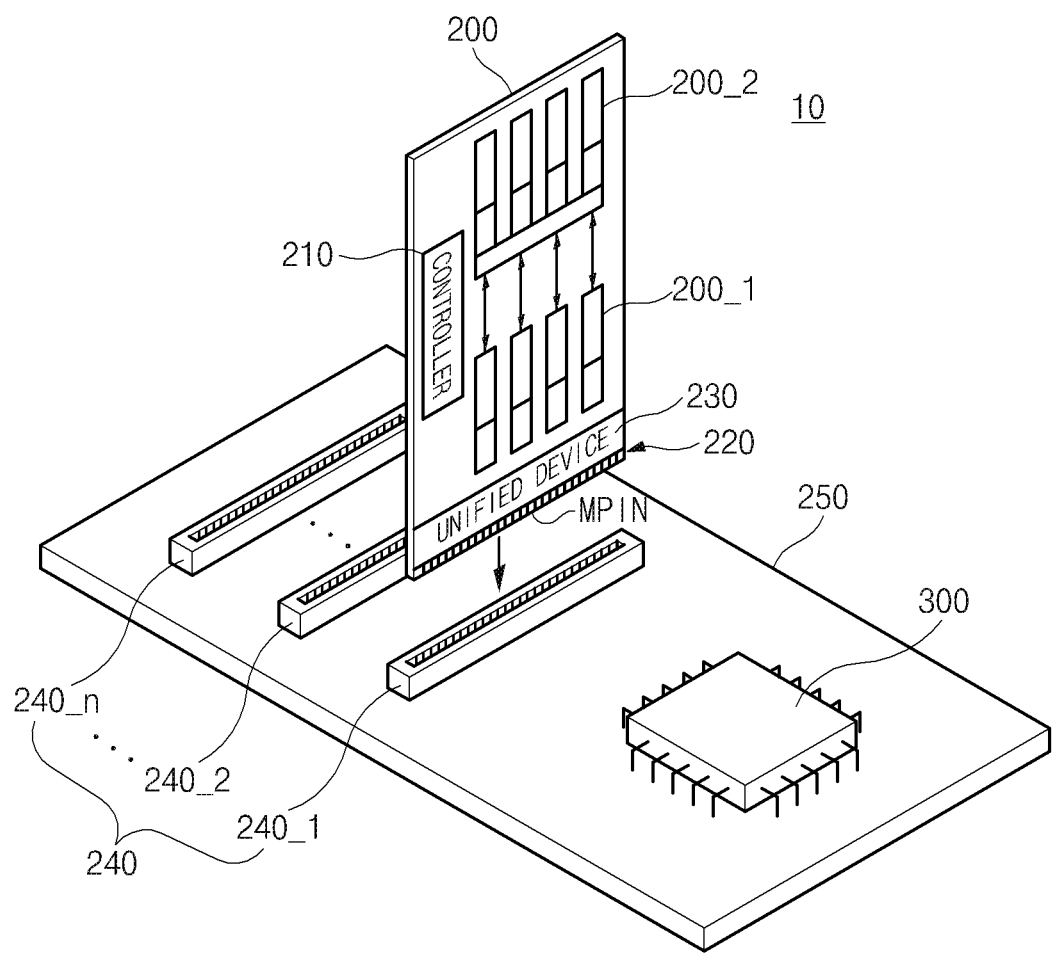
FIG. 20 is a schematic diagram illustrating a semiconductor device according to an embodiment of the present disclosure.

FIG. 20 is a schematic diagram illustrating a semiconductor device according to an embodiment of the present disclosure.

Referring to FIG. 20, the memory system 10 according to an embodiment may include a memory device 200, a host 300, a slot 240, and a main board 500.

The memory device 200 may include various types of memories 200_1, 200_2, a controller 210, and an interface 220. In this case, the memory device 200 may include a single interface 220 in response to various kinds of memories 200_1, 200_2. The controller 210 may control the operations of the memories 200_1, 200_2 and the interface 220.

Memories 200_1, 200_2 contained in the memory device 200 may have different operation characteristics and different form factors. For example, the memory device 200 may include volatile memories and/or non-volatile memories. The volatile memories may be classified into a static RAM (SRAM), a dynamic RAM (DRAM), a synchronous DRAM (SDRAM), etc. The non-volatile memory devices may be classified into a read only memory (ROM), a programmable read-only memory (PROM), an erasable erase and programmable ROM (EEPROM), an electrically erasable and programmable ROM (EPROM), a flash memory, a phase change RAM (PRAM), a magnetic RAM (MRAM), a resistive RAM (RRAM), a ferroelectric RAM (FRAM), etc. In addition, the memory device 200 may further include new memories, for example, a Spin-Torque Transfer Magnetic Random Access Memory (STTMRAM), a Phase Change RAM (PCRAM), a Resistive RAM (ReRAM), etc.

The host 300 may transmit not only a command (request or command signal) but also an address and data to the memory device 200, and may receive data from the memory device 200. In accordance with the embodiment, the host 300 may include at least one of a Central Processing Unit (CPU), a Graphic Processing Unit (GPU), a multimedia processor (MMP), a digital signal processor (DSP), etc.

The host 300 may store memory characteristic information of various memories 200_1, 200_2 contained in the memory device 200, for example, positions (physical and logical positions), types, capacities, temperature information, etc. of the memories. The host 300 may process a command, an address, and data to be appropriate for a memory attempting to execute the command on the basis of the memory characteristics such as the position, type, and capacity of a specific memory, and may then provide the processed command, address, and data. In addition, when receiving data from the specific memory, the host 300 may interpret the received data on the basis of the stored memory characteristic information.

In accordance with the embodiment, the host 300 may provide the command, address, and data on the basis of AC parameters appropriate for each memory. In addition, the host 300 may adjust the size of data capable of being transmitted once or may control a transfer rate according to characteristics of the memory, may perform address mapping or protocol conversion according to characteristics of the memory.

In accordance with the embodiment, the host 300 may periodically refresh volatile memories contained in the memory, and may transmit data contained in the volatile memories to the non-volatile memory in response to power cut-off.

In accordance with the embodiment, the host 300 may directly receive unique characteristics (e.g., the position, type, and capacity of each memory) of each memory contained in the memory device 200 from the external part, may search for the memory device 200 in an initial state, and may thus acquire characteristic information of each memory contained in the memory device 200. Therefore, the memory system 10 according to the embodiment may flexibly operate even when the position of each memory contained in the memory device 200 is changed.

In accordance with the embodiment, type- or category-information of the memory may be contained in information communicated between the host 300 and the memory device 200. Therefore, when the signal transmitted from the host 300 to the memory device 200 is transmitted through the interface 220, the interface may perform interfacing appropriate for the memory. In addition, the host 300 may recognize which memory is associated with the signal received from the memory device 200, such that the host 300 may interpret the received signal.

The interface 220 according to the embodiment may include a unified device 230 configured to perform interfacing between the host 300 and the memory device 200. In this case, the unified device 230 may be controlled by a control signal received from the controller 210. The unified device 230 of the interface 220 may include a physical layer (PHYsical), a Phase Locked Loop (PLL) circuit, etc., such that the unified device 230 may perform the substantial interfacing operation. The unified device 230 may be used to perform signal conversion according to a communication medium for use in a communication protocol. The unified device 230 may be a circuit configured to perform a physical function for use in the communication protocol.

For example, the unified device 230 may also apply interface specifications to various kinds of devices, for example, Non-Volatile Dual In-line Memory Module (NVDIMM), Conventional DIMM, Ultra DIMM, Solid State Drive (SSD), etc.

The unified device 230 may convert data, command, address, etc. adjusted according to characteristics of the memory into other information using the interface appropriate for each memory. The interface 220 according to the embodiment acting as the unified interface may perform interfacing appropriate for various types of memories.

In accordance with the embodiment, specific information indicating which one of the interfacing operations will be executed by the interface 220 may be based on the signal received from the host 300 or memory type information contained in the signal received from the memory device 200.

The unified device 230 may compress or decode the address, command, and data received from the host 300 according to the interface of a destination memory, so as to acquire the result optimized for the destination memory, such that the optimized result can be converted into a physical signal. The unified device 230 may digitize and encode the physical signal, and may then provide the encoded result to the memory device 200.

For example, the interface 220 may communicate with the host 300 through one of several various interface protocols, for example, a Serial Advanced Technology Attachment (SATA) protocol, a Peripheral Component Interconnect Express (PCIe), a Universal Serial Bus (USB) protocol, other connectors, and other interfaces.

For example, the interface 220 may include at least one bus (e.g., an address bus and/or a data bus) having a bus structure associated with an Open NAND Flash Interface (ONFI), a compact flash interface, a multimedia card (MMC), a Secure Digital (SD), CE-ATA, an Industrial Standard Architecture (ISA), a Micro-Channel Architecture (MSA), an Extended ISA (EISA), an Intelligent Drive Electronics (IDE), a VESA Local Bus (VLB), a Peripheral Component Interconnect (PCI), a card bus, a Universal Serial Bus (USB), an Advanced Graphics port (AGP), a Personal Computer Memory Card International Association (PCMCIA) bus, an IEEE 1394 serving as a firewall, and a Small Computer Systems Interface (SCSI). As a result, the interface 220 may communicate with various types of memories contained in the memory device 200.

Therefore, the interface 220 may perform interfacing appropriate for various types of memories contained in the memory device 200.

In accordance with the embodiment, the unified device 230 may serve as the memory controller. The unified device 230 may perform address remapping, and may share memory characteristic information with the host 300 such that it may manage the memory characteristic information at a high level.

In accordance with the embodiment, the memory device 200 may be implemented as a card acting as a single physical object together with the interface 220, and may be mounted to a plurality of slots (240_1, 240_2, . . . , 240_n) contained in the main board 250 through a module pin MPIN.

The memory device 200 may be mounted to individual slots (240_1, 240_2, . . . , 240_n) one by one, and the memory device 200 mounted to the slot may communicate with the host 300 through a conductive line printed on the main board 250.

As described above, data is converted to be appropriate for various types of memories through the host 300 and the interface 220 and is then applied to the memory device 200. As a result, even when all kinds of memories are contained in the memory device 200, all the memories can communicate with the host 300.

Various kinds of memories are contained in the memory device 200, and several memories are interconnected through a relay, such that the integration degree of the memory device 200 mounted to one slot can be increased.

Figure 21:
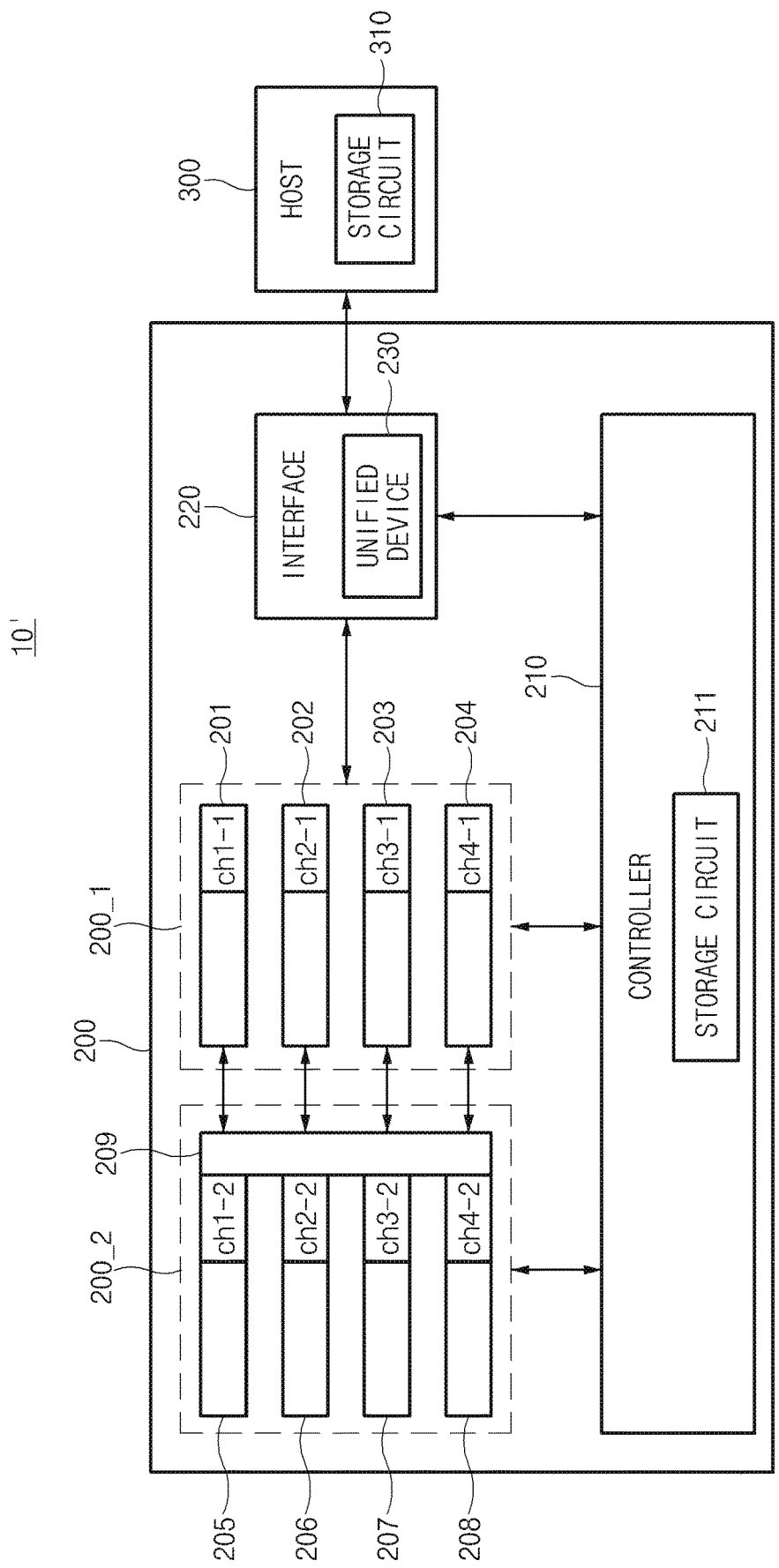
FIG. 21 is a block diagram illustrating a semiconductor device according to an embodiment of the present disclosure.

FIG. 21 is a block diagram illustrating a semiconductor device according to an embodiment of the present disclosure.

Referring to FIG. 21, the memory system 10' may include a memory device 200 and a host 300.

The memory device 200 may include a master memory 200_1, a slave memory 200_2, a controller 210, and an interface 220. The controller 210 may include a storage circuit 211 configured to store information needed for the control operation. In addition, the interface 220 may include the unified device 230 configured to perform interfacing appropriate for the memories 200_1, 200_2.

A plurality of master memories (201, 202, 203, 204) contained in the master memory 200_1 may be coupled to a plurality of slave memories (205, 206, 207, 208) through a relay 209 contained in the slave memory 200_2.

In accordance with the embodiment, the memory device 200 may communicate with the host 300 through the interface 220 over a plurality of channels (ch1, ch2, ch3, ch4). One channel may communicate with the host 300 at one time, and each channel may independently operate. Although the embodiment of the present disclosure has exemplarily disclosed that each of the number of master memories (201, 202, 203, 204), the number of slave memories (205, 206, 207, 208), and the number of channels (ch1, ch2, ch3, ch4) is set to 4 for convenience of description, the scope or spirit of the embodiment of the present disclosure is not limited thereto, and each of the number of memories and the number of channels can also be changed to another number as necessary.

The same kind of memories may be coupled to one channel, such that a plurality of memories may be relayed within a channel through the relay 209 such that each memory may serve as a memory.

For example, as can be seen from FIG. 21, the memory device 200 may include four channels (ch1, ch2, ch3, ch4). The first channel (ch1-1, ch1-2) may include a first master memory 201 and a first slave memory 205. The first master memory 201 may communicate with the host 300 through the interface 220. If storage capacity of the first master memory 201 is insufficient, the first slave memory 205 may guarantee a storage space of data. Assuming that storage capacity is insufficient even when the first slave memory 205 is used, one or more additional slave memories may be mounted to the memory device 200 as necessary.

Although one or more additional slave memories are mounted to the memory device 200 as shown in FIG. 20, the memory device 200 is mounted to one slot 240, such that an additional plane space for the memory space is no longer required. Therefore, the semiconductor device 10' according to the embodiment may easily and flexibly guarantee a data storage space.

The first master memory 201 and the first slave memory 205 may have the same memory characteristics.

In this way, the second master memory 202 and the second slave memory 206 contained in the second channels (ch2-1, ch2-2), the third master memory 203 and the third slave memory 207 contained in the third channels (ch3-1, ch3-2), and the fourth master memory 204 and the fourth slave memory 208 contained in the fourth channels (ch4-1, ch4-2) may have the same memory characteristics.

Accordingly, the host 300 may store memory characteristics (e.g., the position, type, and capacity of each memory) of each memory per channel, as memory characteristic information, in the storage circuit 230, and may then manage the memory characteristics stored in the storage circuit 310.

The interface 300 may confirm connection states of the memories (201-208) contained in the memory device 200, and may perform interfacing between the host 300 and the memory device 200.

In this case, the interfacing operation of the interface 220 may be controlled by a control signal received from the controller 210. That is, the controller 210 may select operation modes of the interface 220 and the unified device 230 on the basis of capacity, speed, latency, operation voltage, etc. of the master memory 200_1 and the slave memory 200_2.

The unified device 230 may be shared by the master memory 200_1 and the slave memory 200_2 through the plurality of channels ch2, ch3, ch4). Different types of memories may be inserted into the unified device 230 through the plurality of channels (ch1, ch2, ch3, ch4). In addition, memories may also be inserted into the unified device 230 using only some channels selected from among the plurality of channels (ch1, ch2, ch3, ch4). The unified device 230 may recognize a connection state between the memories 200_1, 200_2 under the control of the controller 210.

The unified device 230 may include a plurality of operation modes to perform interfacing. That is, the unified device 230 may operate in a first operation mode during a predetermined time, and may operate in a second operation mode during the next time after lapse of the predetermined time. In this case, the first operation mode and the second operation mode may be modes related to frequency change when signals are communicated between the memory device 200 and the host 300. The controller 210 may control the operation mode of the unified device 230 in response to memory characteristic and operation information.

For example, the unified device 230 may perform interfacing at a low clock frequency during the first operation mode, and may perform interfacing at a high clock frequency during the second operation mode. In accordance with the embodiment, the unified device 230 may transmit information stored in the storage circuit 211 to the host 300 during the first operation mode, and may transmit user data stored in the master memory circuit 200_1 and the slave memory circuit 200_2 to the host 300 during the second operation mode. In this case, the user data may refer to command data, protocol data, control data, synchronous data, packet data, or the like executed in the memory device 200 by the external controller. In accordance with the embodiment, the user data may be a generic term of data that is generated and stored when the application is executed by the user, and may further include other types of data in addition to the above-mentioned data.

The embodiment of the present disclosure has exemplarily disclosed that information stored in the storage circuit 211 is transmitted to the host 300 during the first operation mode, or the user data stored in the memories 200_1, 200_2 is transmitted to the host 300 during the second operation mode. However, the scope or spirit of the embodiment of the present disclosure is not limited thereto, and it should be noted that information stored in the storage circuit 211 is transmitted to the host 300 during the second operation mode or the user data stored in the memories 200_1, 200_2 is transmitted to the host 300 during the first operation mode. Signals or data to be transmitted may also be changed according to operation modes. In addition, although the embodiment of the present disclosure has exemplarily disclosed that the operation modes are exemplarily set to first and second modes for convenience of description, the number of operation modes according to the present disclosure is not limited thereto.

The controller 210 may store information needed to control the master memory 200_1, the slave memory 200_2, and the interface 220 in the storage circuit 211. For example, the storage circuit 211 may store memory characteristic information, such as positions (physical and logical positions), types, and capacities of the memories 200_1, 200_2.

If the controller 210 receives a request signal (memory search command) for memory characteristic information from the host 300 through the interface 220, the controller 210 may transmit memory characteristic and operation information stored in the storage circuit 211 to the host 300 through the interface 220. In addition, during a specific operation mode of the memory device 200, the controller 210 may also transmit the memory characteristic and operation information stored in the storage circuit 211 to the host 300 according to a predetermined operation period.

In contrast, the controller 211 may receive information from the host 300 through the interface 220, and may store the received information in the storage circuit 211. In response to information stored in the storage circuit 211, the controller 210 may provide information (e.g., a command, an address, a control signal, data, etc.) appropriate for a specific memory to be used for command execution.

In this case, information stored in the storage circuit 211 may be AC parameters related to the respective memories, wherein the AC parameters are received from the host 300. The command, address, and data stored in the storage circuit 211 may be generated based on the AC parameters. In response to the information stored in the storage circuit 211, the controller 210 may control a data size, a transfer rate, address mapping, a refresh operation, data transmission, and protocol conversion.

Figure 22:
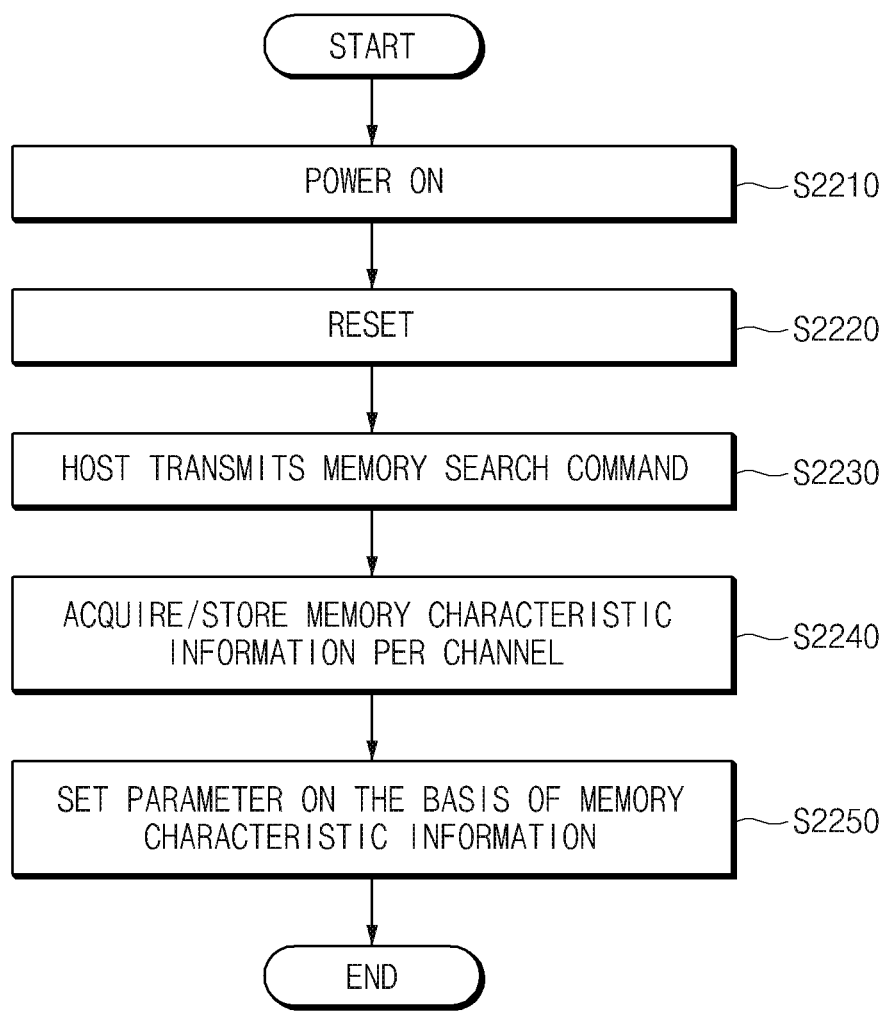
FIG. 22 is a flowchart illustrating the operations of the semiconductor device according to an embodiment of the present disclosure.

FIG. 22 is a flowchart illustrating the operations of the semiconductor device according to an embodiment of the present disclosure. The setting operations of the memory systems (10, 10') will hereinafter be described with reference to FIG. 22.

As described above, various types of memories may be contained in the memory systems (10, 10') according to the embodiment, and types of memories contained in one memory device 200 may be changed in various ways. Therefore, the setting operation indicating the type and characteristics of each memory of a specific channel and characteristics thereof is needed.

The operations of the memory systems (10, 10') according to the embodiments will hereinafter be described with reference to FIGS. 20 to 22.

If the memory system (10, 10') is powered on in step S2210, the memory systems (10, 10') may be reset in operation S2220. The reason why the memory system (10, 10') is reset is that the types and positions of memories contained in the memory device 200 may be changed. However, according to the embodiments, the memory system (10, 10') may not perform resetting.

The host 300 contained in the memory system (10, 10') may transmit a command for searching for a memory contained in the memory device 200 in step S2230. As described above, the memory search command may be executed through such resetting whenever the memory system (10, 10') is powered on, or may be executed at intervals of a predetermined time period.

Upon receiving the memory search command from the host 300, the controller 210 may transmit memory characteristic information of various memories (201-208) contained in the memory device 200 to the host 300 through the interface 220 in response to the received memory search command. The host 300 may store the transmitted memory characteristic information in the storage circuit 310 in step S2240.

In accordance with the embodiment, memory characteristic information of the memory device 200 may be acquired and stored per channel. The memory characteristic information of the memory device 200 may include the position, type, capacity, etc. of each memory.

The host 300 may set the parameters appropriate for memories coupled to individual channels on the basis of the received memory characteristic information in step S2250. For example, the host 300 may adjust the AC parameter. The adjusted AC parameter may also be stored in the storage circuit 310. The host 300 may transmit the adjusted AC parameter information to the controller 210 through the interface 220.

After completion of the setting operation shown in FIG. 22, the host 300 may communicate with the memory device 200 so as to perform the read or write operation. In this case, the host 300 may store the memory characteristic information of the memory located at a specific channel of the memory device 200 in the storage circuit 310. Therefore, the host 300 may transmit the command, address, data, etc. so as to perform the read and write operations appropriate for the memory.

The host 300 may include memory type information of the memory located at a specific channel, such that the host 300 may transmit the command, address, data, etc. to the controller 210 through the interface 220. The command, address, and data transmitted from the host 300 to the controller 210 may be signals obtained by adjusting the AC parameter according to the memory characteristic information.

The interface 220 may convert the command, address, and data received from the host 300 into signals appropriate for the interface used by the memory, upon receiving the memory type information from the host 300. For example, the interface 220 may perform encoding, decoding, or address remapping of the received command, address, and data.

In contrast, if the host 300 receives data from the memory device 200, the host 300 may recognize which channel is associated with data received from the memory device 200, such that the host 300 may interpret the received data using the scheme appropriate for the recognized channel. In accordance with another embodiment, the signal transmitted from the memory device 200 to the host 300 may include memory type information. Therefore, the host 300 may interpret the received signal on the basis of the received memory type information.

As described above, the semiconductor device according to the embodiment allows the host 300 to adjust the AC parameter on the basis of memory characteristic information in association with the memory device 200 including various kinds of memories, and includes the unified interface 220 such that the semiconductor device can interface with various memories through the unified interface 220.

In addition, various memories are mounted to one slot, and can be extended through a relay, resulting in increased integration degree.

As is apparent from the above description, the semiconductor device according to the embodiments includes an interface capable of driving various kinds of memories, such that it can easily and smoothly operate even when other memories having different characteristics from the mounted memories are added.

The semiconductor device according to the embodiments can mount various kinds of memories to a single slot, resulting in an increased integration degree.

Figure 23:
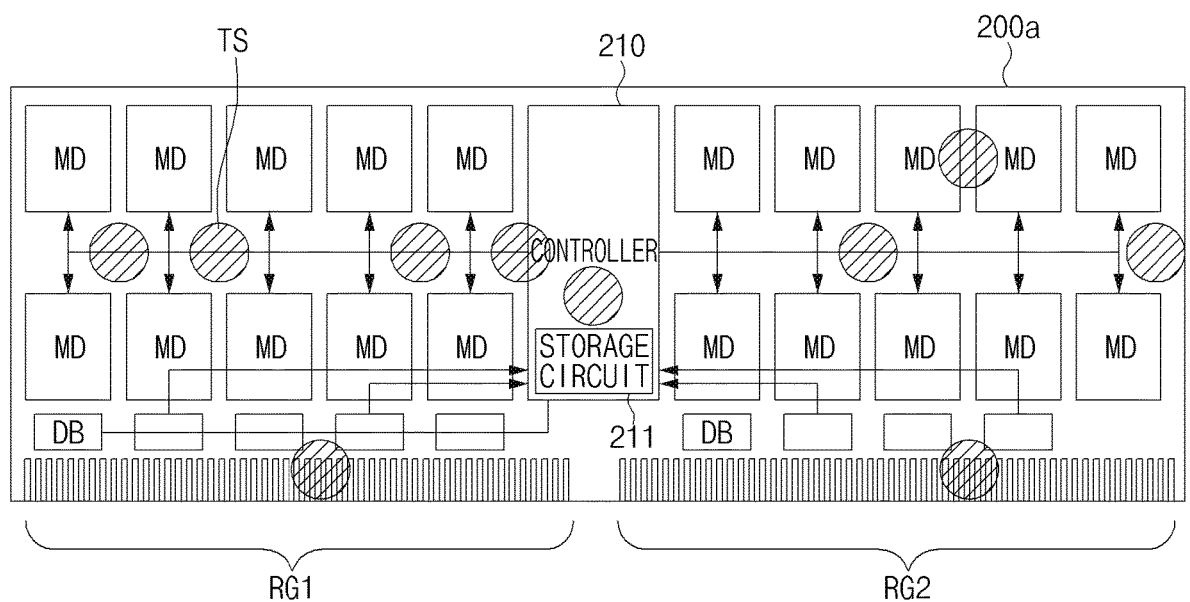
FIG. 23 is a schematic diagram illustrating a memory module according to another embodiment of the present disclosure.

FIG. 23 is a schematic diagram illustrating a memory module 200a according to another embodiment of the present disclosure. The memory module 200a shown in FIG. 23 may be implemented as a module structure. Referring to FIG. 23, the memory module 200a may include a plurality of memory devices (MD), a controller 210, and a plurality of data buffers (DB). The memory module 200a may be implemented as a Dual In-Line Memory Module (DIMM).

Although the memory module 200a according to the embodiment can be applied to the DIMM, the scope or spirit of the present disclosure is not limited thereto. If necessary, the memory module 200a may include a Unbuffered Dual In-line Memory Module (UDIMM), a Registered Dual In-line Memory Module (RDIMM), a Fully Buffered Dual Inline Memory Module (FBDIMM), a Load Reduced Dual In-line Memory Module (LRDIMM), or other memory modules.

In this case, the plurality of memory devices (MD) may be comprised of semiconductor devices. The memory devices (MD) may correspond to the memory unit shown in FIGS. 1 and 7, and may also correspond to the master memory 200_1 and the slave memory 200_2 shown in FIG. 20. The memory devices (MD) may include the same kind of memories or different kinds of memories.

FIG. 23 illustrates a total of 20 memory devices (MD) contained in a board of the memory module 200a. In this case, the 20 memory devices (MD) may be classified into 10 left memory devices and 10 right memory devices based on the controller 210. However, the scope or spirit of the present disclosure is not limited thereto, and the number of memory devices (MD) populated into the memory module 200a is not limited thereto.

The controller 210 may store data accessed by the memory controller 440 in the memory device (MD), and may then manage the stored data. The controller 210 may provide command signals, address, and data to the respective memory devices (MD), such that the controller 210 may control each memory device (MD) to perform the write or read operation. The controller 210 may perform mapping of data allocated to the memory devices (MD), and may manage the mapped data, such that the controller 210 may update the memory devices (MD) according to characteristics of such data.

The controller 210 may store information related to operation states, characteristics, performance parameters, etc. of the plurality of memory devices (MD) in the storage circuit 211. During a control operation mode, the controller 210 may control the memory devices (MD) by referring to data stored in the storage circuit 211.

For example, the memory module 200a may include a temperature sensor (TS) for sensing temperature information. If necessary, a plurality of temperature sensors (TS) may be attached to the front or rear surface of the memory module 200a.

For example, the temperature sensors (TS) may be located in the vicinity of the memory devices (MD) vulnerable to temperature. For example, if the memory devices (MD) are comprised of devices vulnerable to temperature, data storage capability may be changeable according to temperature. Therefore, the temperature sensors (TS) may be located closest to the memory devices (MD).

In accordance with another embodiment, the temperature sensor (TS) may be located close to a specific region having a relatively high temperature. In this case, the specific region having a relatively high temperature may refer to a region in which buses needed to transmit data are collected so that a large change in electric signal occurs in a unit region indicating the specific region. In this case, another region having a high temperature may refer to a region in which the buses are frequently used. For example, the above region in which the buses are frequently used may refer to a place located close to the main core of the controller 210, a place located close to input/output (I/O) lines of the controller 210, a place located close to the I/O lines of the data buffer (DB), a place located close to a region in which traffic has frequently occurred in each bus, and/or a place located close to a region in which signal routing, signal switching, etc. have occurred.

In accordance with still another embodiment, the temperature sensors (TS) may be applied to the embodiment shown in FIG. 20. In FIG. 20, the temperature sensors (TS) may be located between the memory module 200 and the main board 240.

The controller 210 may store temperature information of the memory module 200a in the storage circuit 211, and may control the memory devices (MD) in response to the temperature information stored in the storage circuit 211. The temperature information sensed by the temperature sensors (TS) may serve as new data or modified data, such that the sensed temperature information may be stored in the storage circuit 211. The controller 210 may transmit temperature information measured by the temperature sensors (TS) to the memory controller 440 through the data buffer (DB).

As described above, the memory module 200a according to the present embodiment may include the plurality of temperature sensors (TS), such that the memory module 200a may estimate temperature information of the memory devices (MD) or temperature information of the main board in response to the distance between the temperature sensors (TS) and the measured temperature information.

For example, the controller 210 may estimate temperature information of the memory devices (MD) or peripheral temperature information of the memory devices (MD) using the interpolation or extrapolation scheme.

In addition, the memory module 200a may be classified into one region RG1 corresponding to a first region RG1 and the other region RG2 corresponding to a second region RG2 with respect to the controller 210. The controller 210 may operate the memory devices (MD) in different ways according to the first region RG1 and the second region RG2 in response to temperature information measured by the temperature sensors (TS). For example, if a temperature of the first region TRG2 is higher than a predetermined threshold temperature, the first region RG1 may transition to the idle mode and only the second region RG2 may be activated.

In addition, the data buffer (DB) may buffer data received from the memory controller 440, may transmit the buffered data to the controller 210, and may transmit the buffered data to the memory controller 440.

Figure 24:
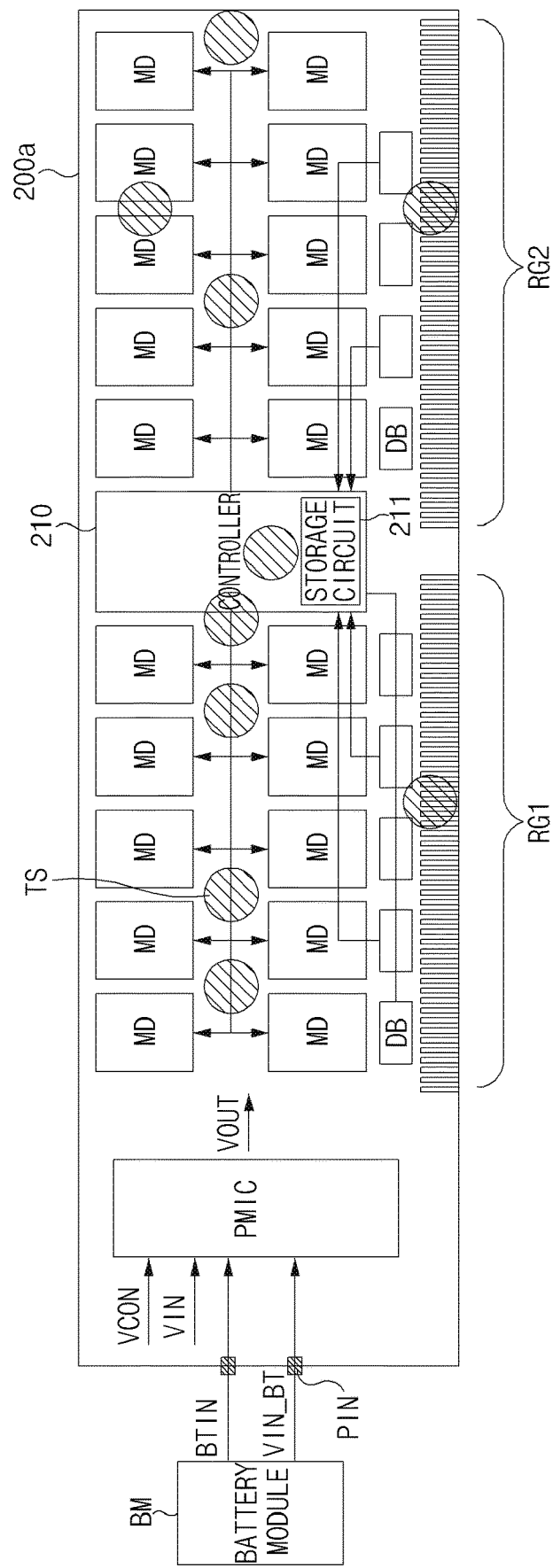
FIG. 24 is a schematic diagram illustrating a memory module according to still another embodiment of the present disclosure.

FIG. 24 is a schematic diagram illustrating a memory module 200a according to still another embodiment of the present disclosure.

Referring to FIG. 24, the memory module 200a may further include a power Management Integrated Circuit (PMIC) as compared to the memory module 200a shown in FIG. 23.

The PMIC may control a power-supply (VOUT) mode applied to the memory module 200a in response to a power control signal (VCON) and an input power-supply voltage (VIN) received from the memory controller 440.

The PMIC may be coupled to a battery module (BM) located outside the memory module 200a. The PMIC may support a function of charging the battery module (BM).

The PMIC may receive a voltage (VIN_BT) from the battery module (BM) through a pin (PIN). The battery module (BM) may be detachably coupled to the memory module 200a, such that the battery module (BM) can be attached to or can be separated from the memory module 200a.

The PMIC may receive battery information (BTIN) from the battery module (BM) through the pin (PIN). In this case, the battery information (BTIN) may include residual storage capacity of the battery module (BM).

Voltage (VIN_BT) and battery information (BTIN) applied to the PMIC can be provided to the memory controller 440 under control of the controller 210.

Figure 25:
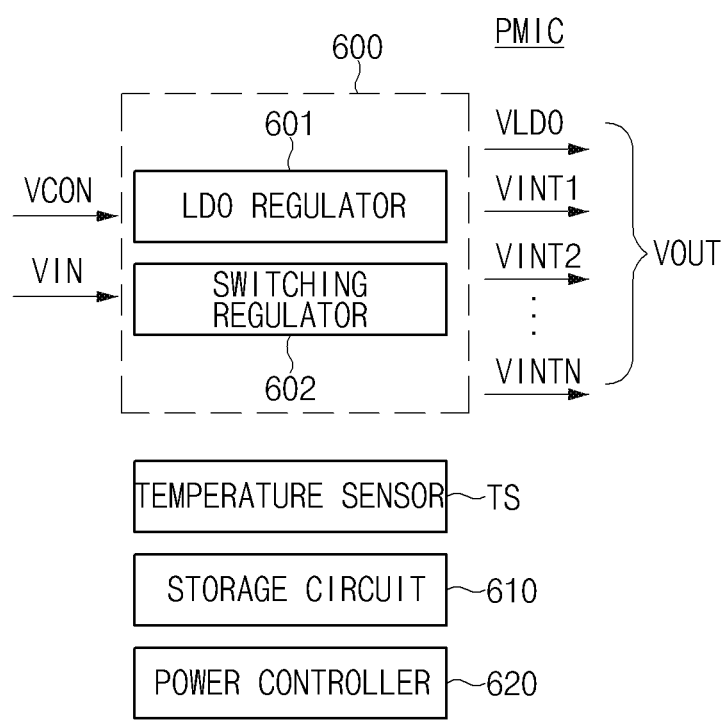
FIG. 25 is a detailed block diagram illustrating a Power Management Integrated Circuit (PMIC) shown in FIG. 24.

FIG. 25 is a detailed block diagram illustrating the power Management Integrated Circuit (PMIC) shown in FIG. 24.

Referring to FIG. 25, the PMIC may include a voltage generator 600, a temperature sensor (TS), a storage circuit 610, and a power controller 620.

The PMIC may include the voltage generator 600 so as to increase power integrity as well as to prevent metal migration. In more detail, the voltage generator 600 may receive an external input power-supply voltage (VIN) having a higher voltage level such that power loss can be minimized. As a result, the voltage generator 600 may generate a power-supply voltage (VOUT) having a lower voltage level while simultaneously having a minimum amount of power loss.

In order to increase power efficiency, the PMIC may implement a multi-level supply voltage system configured to provide a plurality of internal voltages VLDO (VINT1~VINTN) to the memory controller 210, the plurality of memory devices (MD), and the plurality of data buffers (DB).

The voltage generator 600 may include a Low Drop-Out (LDO) regulator 601 and a switching regulator 602. In this case, the voltage generator 600 may include a single LDO regulator 601 and a single switching regulator 602 for convenience of description and better understanding of the present disclosure. However, the scope or spirit of the present disclosure is not limited thereto, and the number of regulators can also be changed to another number of regulators as necessary.

In this case, the LDO regulator 601 may be used to provide the internal voltage (VLDO) having a lower voltage level to the plurality of circuits. The LDO regulator 601 may be simplified in circuit structure. The LDO regulator 601 may be mainly used to provide a power-supply voltage to circuits (e.g., an analog-to-digital converter (ADC), a voltage controller oscillator (VCO), etc.) which are sensitive to the power-supply voltage without generating ripples. The switching regulator 602 may remove ripples from the input power-supply voltage (VIN), such that the switching regulator 602 may supply a plurality of internal voltages (VINT1~VINTN) having different levels.

The PMIC may control the voltage mode of the voltage generator 600 based on the voltage (VIN_BT) and the battery information (BTIN) received from the battery module (BM).

For example, if the memory controller 440 performs some operations dedicated to a specific LDO regulator 601, the PMIC may turn off the switching regulator 602 in response to the power control signal (VCON), or may switch to a sleep mode in response to the power control signal (VCON).

In another example, the voltage generator 600 may generate an input voltage to be applied to each I/O circuit, a Register Clock Driver (RCD), a data buffer (DB), etc. When the residual storage capacity of the battery in response to the battery information (BTIN) is less than reference storage capacity, the PMIC may turn off the voltage generator 600 configured to provide a voltage to each of the above-mentioned circuits and the like, or may transition to the sleep mode.

In another example, the memory module 200a may perform operations of a first mode in which data stored in a volatile memory device selected from among the plurality of memory devices (MD) is transferred to a non-volatile memory device. When the residual storage capacity of the battery in response to the battery information (BTIN) is less than the reference storage capacity, the PMIC may control power source in a manner that only the first mode can be carried out. That is, the PMIC may turn off the voltage generator 600 configured to provide a voltage to the device designed to perform other operations other than operations of the first mode, or may transition to the sleep mode.

In another example, the memory module 200a may perform operations of a second mode associated with storage capacity of the memory devices (MD). When the residual storage capacity of the battery in response to the battery information (BTIN) is less than the reference storage capacity, the PMIC may control power source in a manner that only the second-mode operations can operate. That is, the PMIC may turn off the voltage generator 600 configured to provide a voltage to a device designed to perform other operations other than the second-mode operations, or may transition to the sleep mode.

In addition, the PMIC may include at least one temperature sensor (TS) for sensing a temperature. The temperature information sensed by the temperature sensor (TS) may be stored in the storage circuit 610. The storage circuit 610 may store an output voltage value received from the voltage generator 600.

The power controller 620 may control the voltage generator 600, such that the power controller 620 can control a mode of the power-supply voltage (VOUT) output from the voltage generator 600. The power controller 620 may prevent overvoltage from being applied to the PMIC, and may prevent overvoltage from being output from the PMIC. In addition, the power controller 620 may control operations of the PMIC in response to temperature information and voltage information stored in the storage circuit 610, such that the power controller 620 may prevent a temperature from increasing.

In addition, the power controller 620 may monitor state information of a power source, such that the power controller 620 can determine whether or not a voltage (VOUT) level is stable and can transmit the determined result to the memory controller 440. The power controller 620 may generate an interrupt signal, such that the power controller 620 can stop the power control operation using the interrupt signal.

Figure 26:
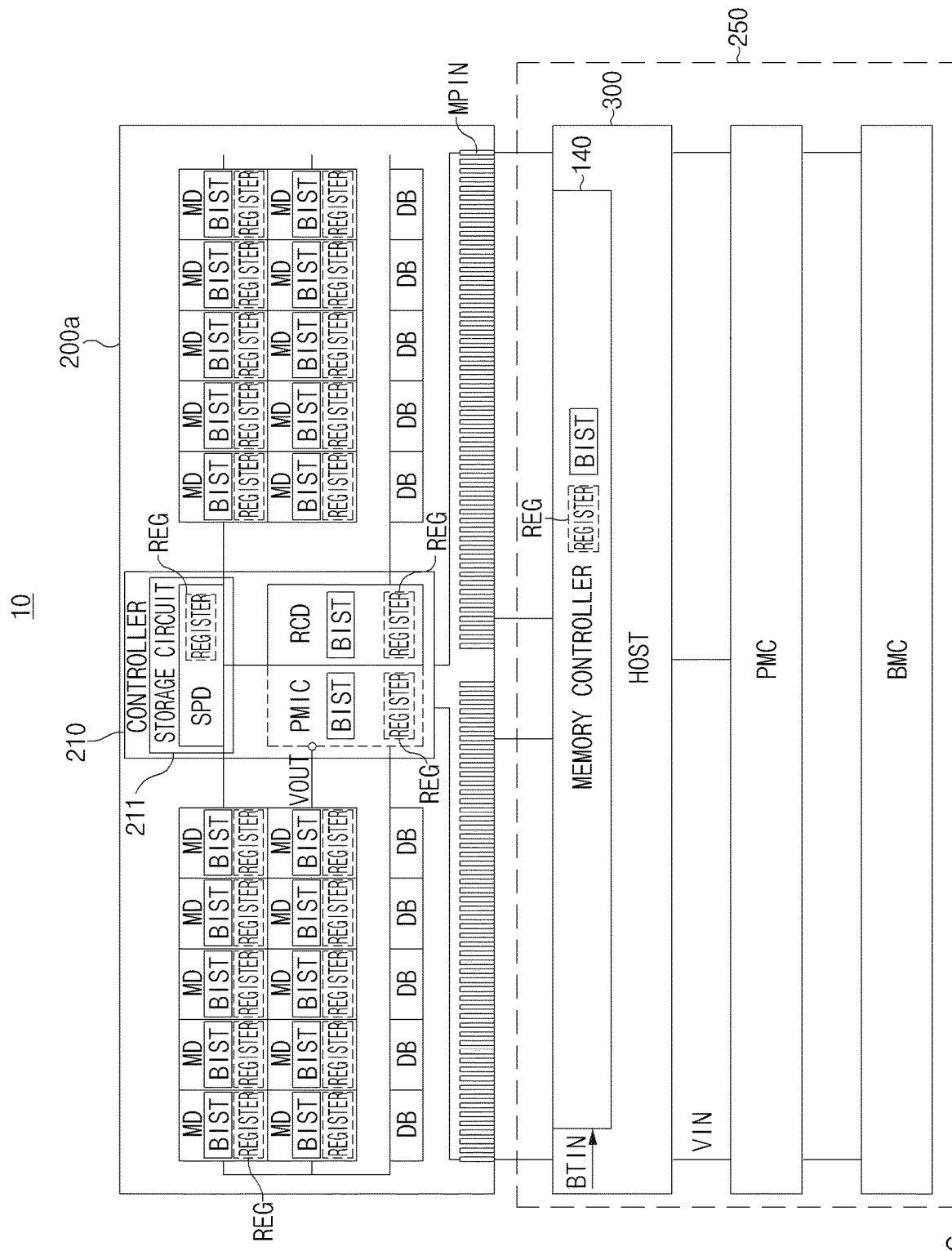
FIG. 26 is a schematic diagram illustrating a memory system according to an embodiment of the present disclosure.

FIG. 26 is a schematic diagram illustrating a memory system 10 according to an embodiment of the present disclosure.

Referring to FIG. 26, the memory system 10 may be coupled to the main board 250 of the memory module 200a through one or more module pins (MPIN), and associated connection structure and explanation thereof are identical to those of FIG. 20.

Detailed description of the memory devices (MD) and the data buffers (DB) is identical to those of FIG. 23, and as such a detailed description thereof will herein be omitted for convenience of description. In addition, the PMIC has already been disclosed in FIG. 24, and as such a detailed description thereof will herein be omitted for convenience of description. However, although FIG. 24 illustrates the PMIC located outside the controller 210 for convenience of description, the scope or spirit of the present disclosure is not limited thereto, and the PMIC may be located outside the controller 210 or may be contained in the controller 210.

The controller 210 may include the storage circuit 211, the PMIC, and the Register Clock Driver (RCD).

The storage circuit 211 contained in the controller 210 may include a temperature register, for example, a Serial Presence Detect (SPD) circuit and the like. The SPD circuit may be implemented as an Electrically Erasable Programmable Read-Only Memory (EEPROM). The SPD circuit may include at least one of various kinds of information of the memory module 200a, for example, initial information, device information, and temperature information of the memory module 200a. For example, the SPD circuit may include various kinds of information of the memory module 200a, for example, a module shape, a module structure, storage capacity, a module type, execution environment, a temperature, etc. of the memory module 200a.

The temperature information stored in the SPD circuit may be applied to the memory devices (MD), such that the resultant temperature information may be used as an element for controlling operation speed, time, duration, etc. of various operations (e.g., a read operation, a write operation, an erase operation, a refresh operation, and the like).

The RCD may active or enable command, address, and clock signals received from the memory controller 440, such that the RCD may provide the activated command, address, and clock signals to the memory devices (MD). In addition, the RCD may further provide the clock signal to the data buffers (DB) as necessary. The RCD may convert command and address information needed for the data buffers (DB) into a buffer control signal through one or more buses, and may provide the buffer control signal.

The host 300 may include a memory controller 440 to control operations of the memory module 200a. Although FIG. 7 has illustrated the memory controller 440 and the host 300 separated from each other for convenience of description, the scope or spirit of the present disclosure is not limited thereto, and the host 300 shown in FIG. 26 may include the controller 440 as necessary.

The memory controller 440 may operate in response to a request signal. In this case, the memory controller 440 may be a processor, for example, a Central Processing Unit (CPU), an Application Processor (AP), a Graphics Processing Unit (GPU), etc.

The memory controller 440 may determine priority of data to be communicated between the memory devices (MD) in consideration of the residual storage capacity of the battery module (BM). For example, when the residual storage capacity of the battery in response to the battery information (BTIN) is less than the reference storage capacity, the memory controller 440 may primarily transmit high-priority data having high importance. In this case, the high-priority data may be arranged in the order of metadata-→map data→user data, etc.

The PMC may provide a power-supply voltage to constituent elements contained in the main board 250, and may manage the constituent elements. The PMC may include at least one of a Voltage Regulator (VR) and a Voltage Regulator Module (VRM). Input power-supply voltage (VIN) generated by the PMC may be provided to the memory module 200a and the host 300.

A Board Management Controller (BMC) may manage operations of the main board 250. That is, the BMC may test and manage various tasks to be performed by the main board 250. The BMC may real-time control a voltage of the voltage regulator module (VRM) using the PMC.

The system 10 may include the PMIC and the PMC to provide a power-supply voltage to the memory module 200a. That is, the system 10 may provide a power-supply voltage to all modules mounted to each of the host 300, the memory modules 200a, and the main board 250 through the PMC contained in the main board 250. The system 10 may provide a power-supply voltage needed for the corresponding memory module 200a through the PMC contained in the memory module 200a.

Generally, the memory module 200a may use a predetermined power source (or a predetermined power-supply voltage) according to specifications. However, according to the present embodiment, a potential of the power source can be controlled according to a memory operation margin of a memory vendor. That is, according to the present embodiment, different power-supply voltages (VOUT) can be applied to the respective memory modules 200a, the respective memory devices (MD), or the respective manufacturing companies of the memory devices (MD).

The memory system according to the present embodiment may include a register (REG) configured to store characteristic information of the respective memory devices (MD). For example, each of the storage circuit 211, the memory device (MD), the PMIC, the RCD, and the memory controller 440 may include a register (REG). The register (REG) may include characteristic information of each memory, i.e., parameter information, operation mode information, etc. The register (REG) may include a Mode Register Set (MRS) for storing parameter information, operation mode information, etc.

After the memory vendor (i.e., the manufacturing company of memories or modules) has completely tested characteristic information of the memory devices (MD) and the memory module 200a, a power potential optimized for the memory module 200a or each memory device (MD) can be detected. The detected optimum power potential value may be stored in the SPD circuit of the storage circuit 211. The detected optimum power potential value may be stored in the register (REG) of each memory device (MD). During the initialization process of the memory system 10, the PMIC may control the power-supply voltage (VOUT) to be applied to each memory device (MD) by referring to the power potential value stored in the SPD circuit.

In the present embodiment, when power-supply voltage levels are controlled in different ways according to operation margin states of the memory devices (MD), it may be possible to satisfy desired throughput and additional performance within the specification decided by the system 10. For example, the PMIC may establish different power potentials in the respective memory devices (MD), may improve parameter characteristic information of the memory devices (MD), and may improve operational speeds of the memory devices (MD), resulting in reduction in power of the respective memory devices (MD).

If the power potential levels of the memory devices (MD) are changed and controlled independently from each other, parameter characteristics of the memory devices (MD) can be improved. The parameter characteristics of the memory devices (MD) may include a refresh operation parameter, a write operation parameter, an asynchronous operation parameter, etc.

For example, the parameters for the refresh operation may include a refresh cycle (tREF), a unit refresh cycle (tREFI) corresponding to a value acquired by dividing the refresh cycle (tREF) by the number of row addresses, a refresh cycle (tREFC) corresponding to a time needed for the refresh operation from a precharge command), etc. By the power-supply voltage (VOUT) received from the PMIC, characteristics of the refresh parameters stored in the register (REG) can be improved. The PMIC may control the power-supply voltage (VOUT) for improving refresh parameter characteristics based on temperature information stored in the storage circuit 610.

The parameters for the write operation may include a write recovery (tWR) parameter. The PMIC may control the power-supply voltage (VOUT) for improving write recovery (tWR) parameter characteristics based on temperature information stored in the storage circuit 610.

In addition, the parameters for the asynchronous operation may include various parameters related to asynchronous operation characteristics such as tRCD (RAS to CAS delay time), tRP (RAS Precharge time), tAA (Column Address Access time), etc. the PMIC may control the power-supply voltage (VOUT) for improving asynchronous operation parameter characteristics based on temperature information stored in the storage circuit 610.

In addition, if the power potentials of the respective memory devices (MD) are changed and controlled independently from each other, parameter characteristics related to the operation speed of the memory devices (MD) can be improved. The parameters related to the operation speeds may include asynchronous parameters, for example, a clock cycle (tCK), a write latency (WL) (i.e., CWL(CAS Write Latency)+AL(Additional Latency)), Read Latency (RL) (i.e., CL(CAS Latency)+AL), On Die Termination (ODT), etc. The PMIC may control the power-supply voltage (VOUT) for improving parameter characteristics related to the operation speed based on the temperature information stored in the storage circuit 610.

In accordance with the present embodiment, setting information of the Mode Register Set (MRS) stored in the register (REG) can be changed to control the electric potentials of the respective memory devices (MD) in different ways.

In accordance with the present embodiment, a built-in self-test (BIST) circuit may be used to test the respective memory devices (MD). For example, each of the memory devices (MD), the PMIC, the RCD, and the memory controller 440 may include a built-in self-test (BIST) circuit.

During the initialization process of the system 10, each memory device (MD) may be tested by the BIST circuit, such that optimum power potential value can be detected. The detected optimum power potential value may be stored in the SPD circuit of the storage circuit 211. The detected optimum power potential value may be stored in the register (REG) of each memory device (MD). The PMIC may control the power-supply voltage (VOUT) supplied to each memory device (MD) by referring to the power potential value stored in the SPD circuit.

In order to perform the BIST operation using each memory device (MD), it is necessary for the system 10 to support the above BIST operation. To this end, the PMIC, the RCD, and the memory controller 440 can be tested by the BIST circuit. When temperature information is needed during execution of the test mode in the BIST circuit, it may be possible to use temperature information detected by the temperature sensors (TS). Test information performed by each BIST circuit may be stored in the storage circuit 211 of the controller 210. Test information performed by each BIST circuit may be stored in the register (REG) of each memory device (MD). The PMIC may variably control the power-supply voltage (VOUT) supplied to the respective memory devices (MD) in response to information stored in the storage circuit 211. When the power-supply voltage (VOUT) received from the PMIC is changed, each memory device (MD) may control parameters or may change setting information of the MRS.

From the viewpoint of the system, the number of memory devices (MD) contained in the main board 250 may gradually increase. Therefore, provided that the internal voltage VLDO (VINT1~VINTN) corresponding to a relatively low voltage is transmitted by a physically long distance, a power consumption issue such as ID drop may occur. In addition, the higher the operation speed of each device, the larger the amount of leakage current. As the controller 210 and each of the memory devices (MD) are gradually reduced in size, there is a need to more precisely control the voltage level.

In addition, since the memory module 200a includes the plurality of memory devices (MD) in a single module, there is a need for different control schemes to be applied to the respective memory devices (MD).

For example, the memory devices (MD) can be implemented as different memory devices having different processing speeds. A higher-speed memory device may be arranged in a place close to the I/O circuit or the data buffer (DB), a relatively lower-speed memory device corresponding to one kind of the previous-generation memory devices may be arranged in another place, and a relatively high-reliability memory device corresponding to another kind of the previous-generation memory devices may also be arranged in yet another place.

Therefore, in accordance with the present embodiment, different power-supply voltages can be applied to the memory devices (MD) of the memory module 200a. That is, a higher power-supply voltage can be applied to a higher-speed memory device from among the plurality of memory devices (MD). In contrast, a lower power-supply voltage can be applied to a lower-speed memory device from among the plurality of memory devices (MD).

Those skilled in the art will appreciate that the present disclosure may be carried out in other specific ways than those set forth herein without departing from the spirit and essential characteristics of the present disclosure. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present disclosure or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A memory system comprising:
   a plurality of memory devices;
   a controller configured to control operations of the memory devices; and
   a plurality of temperature sensors arranged in the memory devices and the controller, and in any specific peripheral region of the memory devices and the controller, and configured to sense temperature information,
   wherein the controller controls operations of the memory devices in response to the temperature information sensed by the temperature sensors,
   wherein the controller limits a power source to be applied to memory devices, each of which has a temperature higher than a specific temperature, in response to the temperature information,
   wherein the plurality of memory devices are divided into a first region and a second region based on the controller,
   wherein the controller operates a plurality of memory devices for each of the first region and the second region based on the temperature information measured by the temperature sensor and changes operation mode in a region having a temperature higher than a predetermined threshold among the first region and the second region.

2. The memory system according to claim 1, wherein the controller controls the memory devices to be operated in different ways according to specific regions in response to the temperature information.

3. The memory system according to claim 1, wherein the controller operates an idle mode in a region having a temperature higher than a predetermined threshold among the first region and the second region.

4. The memory system according to claim 1, further comprising:
   a data buffer configured to transmit the temperature information stored in the controller to a memory controller, and transmit control information of the memory controller to the controller.

5. The memory system according to claim 4, wherein:
   some temperature sensors selected from among the plurality of temperature sensors are arranged in a peripheral region of the data buffer.

6. A memory system comprising:
   various types of memory devices;
   a plurality of temperature sensors arranged in the memory devices and the controller, and in any specific peripheral region of the memory devices and the controller, and configured to sense temperature information;
   a controller configured to control operation of the memory devices in response to the temperature information sensed by the temperature sensors; and
   a storage circuit configured to store characteristic information of the memory devices generated for a channel and an AC parameter set to control the memory devices and generated for the memory devices based on the temperature information.

7. The semiconductor device according to claim 6, wherein the storage circuit is configured to store at least one of data, command, and address for the memories, wherein the data, the command, and the address are generated on the basis of the AC parameter.

8. The semiconductor device according to claim 6, wherein the controller is configured to transmit information stored in the storage circuit to a host through an interface according to a predetermined operation period.

9. The semiconductor device according to claim 6, wherein the controller is configured to select an operation mode of an interface according to characteristic information of at least one of capacity, speed, latency, temperature and operation voltage of the memory devices.

10. The semiconductor device according to claim 6, wherein the controller is configured to transmit the memory characteristic information and operation information to a host through an interface, upon receiving a signal for requesting the memory characteristic information from the host.

11. The semiconductor device according to claim 6, wherein the controller is configured to control an operation of at least one of a data size, a transfer rate, address mapping, a refresh operation, data transmission, and protocol conversion of the memory devices.

12. The semiconductor device according to claim 6, wherein the memory characteristic information includes information of at least one of position information, type information, and capacity information of the memory devices.

13. The semiconductor device according to claim 6, further comprising:
    an interface configured to perform address remapping on the basis of type information of the memory devices.

14. The semiconductor device according to claim 6, further comprising:
    an interface configured to check a connection state of the memory devices for the channel.

15. The semiconductor device according to claim 14, wherein the interface includes:
    a unified device controlled by the controller, configured to perform signal conversion in response to characteristic information of the memory devices.

16. The semiconductor device according to claim 15, wherein the unified device includes a physical layer.

17. The semiconductor device according to claim 15, wherein the unified device includes a plurality of operation modes, and selects any one of the plurality of operation modes according to a control signal of the controller.

18. The semiconductor device according to claim 15, wherein the unified device operates in a first operation mode during a predetermined time, and enters and operates in a second operation mode after lapse of the first operation mode.

19. The semiconductor device according to claim 18, wherein the first operation mode and the second operation mode are operated in any one of a low clock frequency mode and a high clock frequency mode.

20. The semiconductor device according to claim 18, wherein any one mode of the first operation mode and the second operation mode is operated for impedance calibration between the memory devices.

\* \* \* \* \*